US008867194B2

(12) United States Patent
Woytowitz et al.

(10) Patent No.: US 8,867,194 B2
(45) Date of Patent: Oct. 21, 2014

(54) PROGRAMMABLE LANDSCAPE LIGHTING CONTROLLER WITH SELF-DIAGNOSTIC CAPABILITIES AND FAIL SAFE FEATURES

(75) Inventors: Peter J. Woytowitz, San Diego, CA (US); Darrin I. Schmuckle, Vista, CA (US)

(73) Assignee: Hunter Industries, Inc., San Marcos, CA (US)

( * ) Notice: Subject to any disclaimer, the term of this patent is extended or adjusted under 35 U.S.C. 154(b) by 530 days.

(21) Appl. No.: 13/189,718

(22) Filed: Jul. 25, 2011

(65) Prior Publication Data

US 2012/0274219 A1    Nov. 1, 2012

Related U.S. Application Data

(63) Continuation-in-part of application No. 13/098,319, filed on Apr. 29, 2011, now Pat. No. 8,498,099.

(51) Int. Cl.
*H02B 1/00* (2006.01)
*H05K 5/00* (2006.01)
*H05B 37/02* (2006.01)
*H05B 37/03* (2006.01)

(52) U.S. Cl.
CPC .......... *H05K 5/0017* (2013.01); *H05B 37/0281* (2013.01); *H05B 37/029* (2013.01); *H05B 37/0254* (2013.01); *Y02B 20/42* (2013.01); *H05B 37/03* (2013.01)
USPC ........................................ 361/640; 361/600

(58) Field of Classification Search
USPC ......... 361/640, 600, 601, 603, 610, 614, 615, 361/627; 700/9, 10, 11, 12, 13, 14, 15, 16, 700/17, 18
See application file for complete search history.

(56) References Cited

U.S. PATENT DOCUMENTS

| | | | |
|---|---|---|---|
| 6,443,783 B1 | 9/2002 | Beadle | 439/814 |
| 6,497,592 B1 | 12/2002 | Beadle | 439/814 |
| 7,257,465 B2* | 8/2007 | Perez et al. | 700/284 |
| 7,457,678 B2 | 11/2008 | Porter | 700/284 |
| 7,457,687 B1* | 11/2008 | Porter | 700/284 |
| 8,271,144 B2* | 9/2012 | Kah, Jr. | 700/284 |
| 2005/0055106 A1* | 3/2005 | Beutler et al. | 700/11 |
| 2005/0231458 A1* | 10/2005 | Miki | 345/102 |
| 2008/0058964 A1* | 3/2008 | Nickerson et al. | 700/19 |
| 2010/0084985 A1 | 4/2010 | Woytowitz | 315/210 |

* cited by examiner

*Primary Examiner* — Minh D A
(74) *Attorney, Agent, or Firm* — Knobbe, Martens, Olson & Bear LLP

(57) ABSTRACT

A lighting controller includes a housing and a power transformer mounted in the housing for stepping down an inputted AC power signal at a first higher voltage to at least one output AC power signal at a second lower voltage for powering a plurality of light fixtures. The controller further includes a switching device that can be closed and opened to connect and disconnect a primary winding of the power transformer to a source of AC power that can provide the inputted AC power signal. At least one wire connection terminal is connected to a secondary winding of the power transformer. A face pack is removably mounted in the housing and is operatively connected to the source of AC power and the switching device. The face pack includes a display, at least one manually actuable input device, a processor, a memory operatively connected to the processor, and an operational program stored in the memory. The operational program is executable by the processor for allowing a user to enter ON and OFF times via the manually actuable input device and for closing and opening the switching device in accordance therewith. The processor can detect and display the current draw, and can detect overheat and current overload conditions, and disconnect the power transformer from the source of AC power in response to the same.

41 Claims, 36 Drawing Sheets

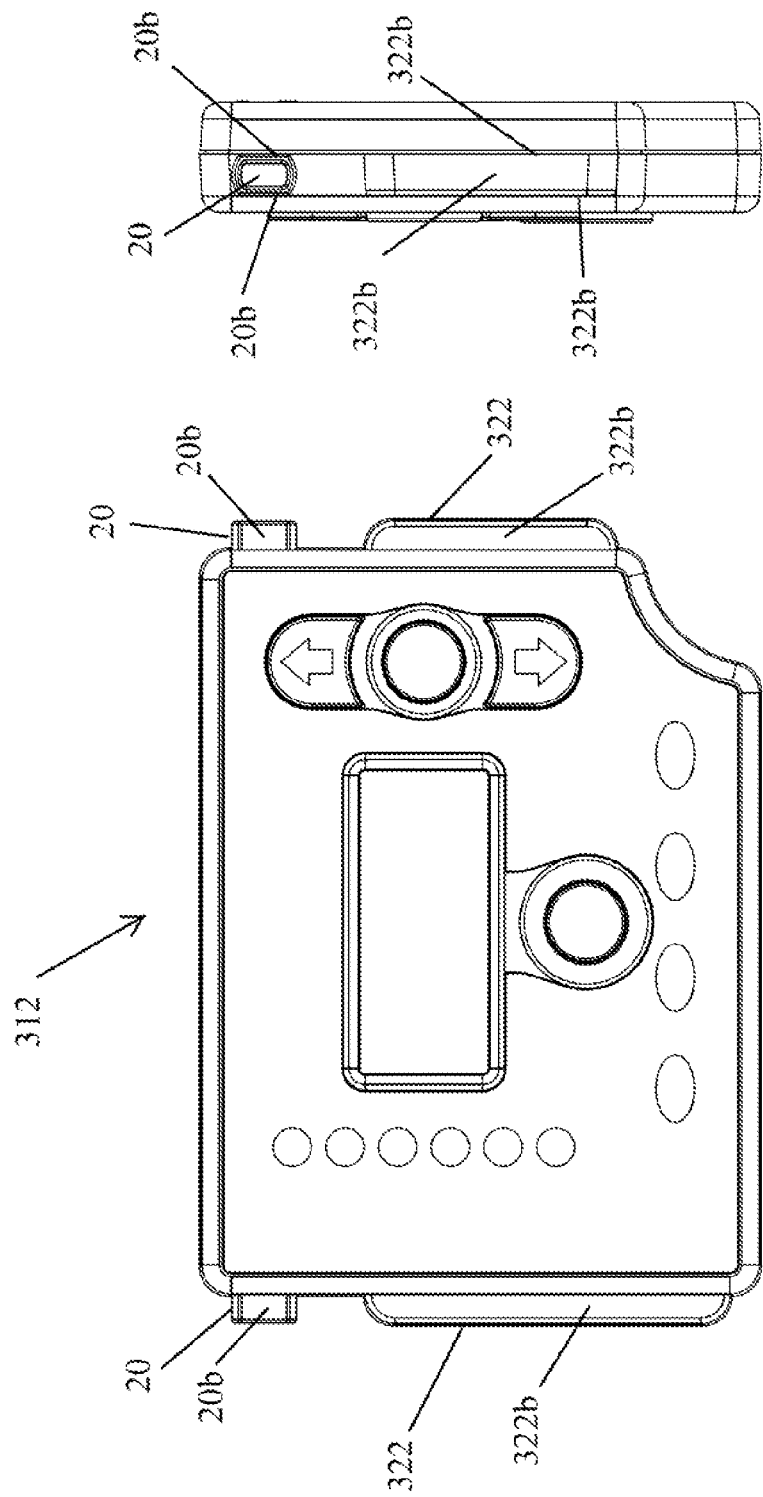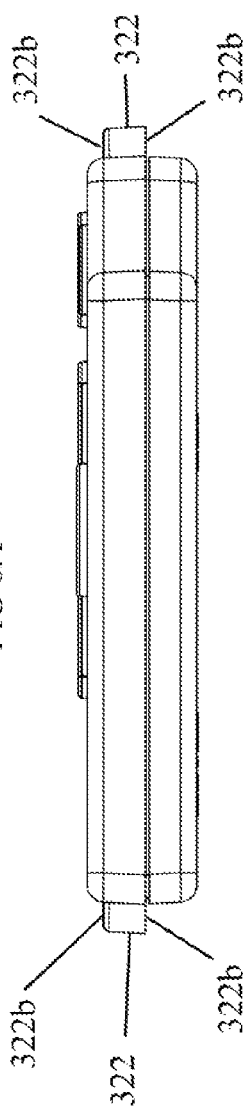

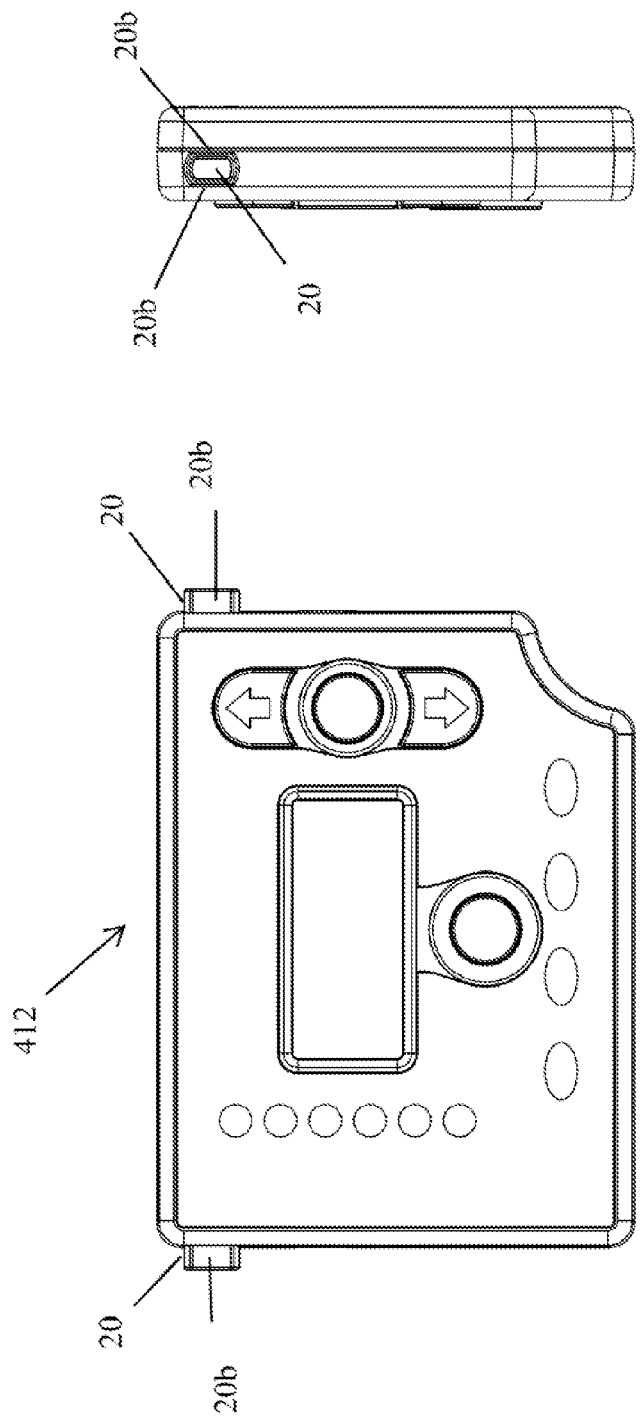
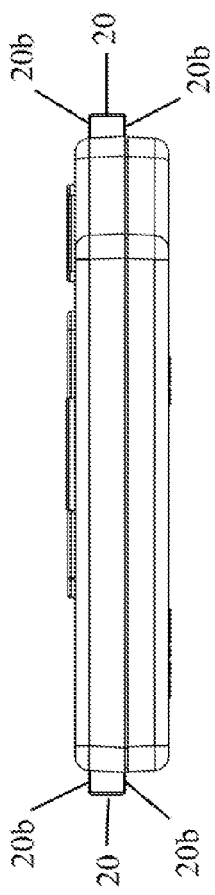
FIG. 7A
FIG. 7B
FIG. 7C

PROGRAMMABLE LANDSCAPE LIGHTING CONTROLLER WITH SELF-DIAGNOSTIC CAPABILITIES AND FAIL SAFE FEATURES

CROSS-REFERENCE TO RELATED APPLICATION

This application is a continuation-in-part of, and claims priority based upon, U.S. patent application Ser. No. 13/098,319 filed Apr. 29, 2011 U.S. Pat. No. 8,498,099 by Darrin I. Schmuckle and entitled "Landscape Controller Housing with Pivotable Locking Face Pack", the entire disclosure of which is hereby incorporated by reference. Said application Ser. No. 13/098,319 is assigned to Hunter Industries, Inc., the assignee of the subject continuation-in-part application.

FIELD OF THE INVENTION

The present invention relates to power supplies, and more particularly, to low voltage electronic power supplies for controlling landscape lighting.

BACKGROUND OF THE INVENTION

Landscape light fixtures are often installed around residences, apartments and commercial buildings for aesthetic enhancement and to improve safety. Commercially available low voltage incandescent landscape lighting controllers typically include a large power transformer (e.g. up to nine hundred watts) that steps down the one hundred and twenty volt household AC voltage to a safer level of twelve volts. This power transformer is typically switched ON and OFF by an off-the-shelf plug-in timer, similar to those used in conjunction with holiday lights. One such timer is the INTERMATIC® TN111C standard AC lamp and appliance timer commercially available from Intermatic, Inc. of Spring Grove, Ill. This analog timer has plastic pins that can be manually set on a motor driven dial face to establish the ON and OFF times. Landscape lighting controllers of this type are primitive and do not offer a variety of features that would be desirable for a homeowner or landscape professional.

SUMMARY

In accordance with one aspect of the present invention a landscape controller includes an outer housing and a control panel mounted in the outer housing. The control panel includes a display, at least one manually actuable input device, a processor, a memory operatively connected to the processor, and an operational program stored in the memory and executable by the processor for allowing a user to enter ON and OFF times. The control panel and the housing include structures for allowing the control panel to be pivoted and slid within the outer housing between a first use position and a second service position.

In accordance with another aspect of the present invention, a lighting controller includes a housing and a power transformer mounted in the housing. The power transformer can step down an inputted AC power signal at a first higher voltage to at least one output AC power signal at a second lower voltage for powering a plurality of light fixtures. The controller further includes a switching device that can be closed and opened to connect and disconnect a primary winding of the power transformer to a source of AC power that can provide the inputted AC power signal. At least one wire connection terminal is connected to a secondary winding of the power transformer. A face pack is removably mounted in the housing and is operatively connected to the source of AC power and the switching device. The face pack includes a display, at least one manually actuable input device, a processor, a memory operatively connected to the processor, and an operational program stored in the memory. The operational program is executable by the processor for allowing a user to enter ON and OFF times via the manually actuable input device and for closing and opening the switching device in accordance therewith.

In accordance with another aspect of the present invention a lighting controller includes a housing and a power transformer mounted in the housing. The power transformer can step down an inputted AC power signal at a first higher voltage to at least one output AC power signal at a second lower voltage for powering a plurality of light fixtures. The lighting controller further includes a switching device that can be closed and opened to connect and disconnect a primary winding of the power transformer to a source of AC power that can provide the inputted AC power signal. At least one wire connection terminal is connected to a secondary winding of the power transformer. A current sensor is connected to the secondary winding and can sense an amount of current drawn by a plurality of lights connected to the secondary winding. A control panel is mounted in the housing and is operatively connected to the source of AC power, the switching device and the current sensor. The control panel includes a display, at least one manually actuable input device, a processor, a memory operatively connected to the processor, and an operational program stored in the memory. The operational program is executable by the processor for allowing a user to enter ON and OFF times via the manually actuable input device, for closing and opening the switching device in accordance therewith, and for indicating on the display the amount of current drawn by the plurality of lights.

In accordance with another aspect of the present invention a lighting controller includes a housing and a power transformer mounted in the housing. The power transformer can step down an inputted AC power signal at a first higher voltage to at least one output AC power signal at a second lower voltage for powering a plurality of light fixtures. The lighting controller further includes a switching device that can be closed and opened to connect and disconnect a primary winding of the power transformer to a source of AC power that can provide the inputted AC power signal. At least one wire connection terminal is connected to a secondary winding of the power transformer. A current sensor is included in the lighting controller that can sense an amount of current drawn by a plurality of lights connected to the secondary winding. A control panel is mounted in the housing and is operatively connected to the source of AC power, the switching device and the current sensor. The control panel includes a display, at least one manually actuable input device, a processor, a memory operatively connected to the processor, and an operational program stored in the memory. The operational program is executable by the processor for allowing a user to enter ON and OFF times via the manually actuable input device and for closing and opening the switching device in accordance therewith and for detecting an overload condition based on an output of the current sensor. The operational program causes the switching device to disconnect the power transformer from the source of AC power in response to the detection of the overload condition, and causes the switching device to re-connect the power transformer to the source of AC power at a next scheduled ON time. The operational program may show the current draw on the display.

In accordance with another aspect of the present invention a lighting controller includes a housing and a power transformer mounted in the housing. The power transformer can step down an inputted AC power signal at a first higher voltage to at least one output AC power signal at a second lower voltage for powering a plurality of light fixtures. The lighting controller further includes a switching device that can be closed and opened to connect and disconnect a primary winding of the power transformer to a source of AC power that can provide the inputted AC power signal. At least one wire connection terminal is connected to a secondary winding of the power transformer. The lighting controller further includes a photocell. A control panel is mounted in the housing and is operatively connected to the source of AC power, the switching device and the photocell. The control panel includes a display, at least one manually actuable input device, a processor, a memory operatively connected to the processor, and an operational program stored in the memory. The operational program is executable by the processor for allowing a user to enter ON and OFF times via the manually actuable input device and for closing and opening the switching device in accordance therewith. The operational program also allows the processor to periodically determine a present light level based on an output signal from the photocell. The processor can detect a LIGHT/DARK threshold that is used to control the switching device to connect and disconnect the power transformer to the source of AC power in response to the detection of the LIGHT/DARK threshold.

In accordance with another aspect of the present invention a lighting controller includes a housing and a power transformer mounted in the housing. The power transformer can step down an inputted AC power signal from a source of AC power at a first higher voltage to at least one output AC power signal at a second lower voltage for powering a plurality of light fixtures. At least one wire connection terminal is connected to a secondary winding of the power transformer. A first temperature sensor is located adjacent the power transformer for providing a first temperature signal. The lighting controller also includes a second transformer that can also be connected to the source of AC power. A rectifier circuit is connected to the second transformer for supplying a DC power signal. A second temperature sensor is located adjacent the second transformer for providing a second temperature signal. A control panel is mounted in the housing and is operatively connected to the source of AC power and the switching device. The control panel includes a display, at least one manually actuable input device, a processor, a memory operatively connected to the processor, and an operational program stored in the memory. The operational program is executable by the processor for allowing a user to enter ON and OFF times via the manually actuable input device and for closing and opening the switching device in accordance therewith. The operational program further allows the processor to detect an overheat condition based on the first temperature signal or the second temperature signal. The processor can cause the switching device to disconnect the power transformer from the source of AC power in response to the detection of the overheat condition.

BRIEF DESCRIPTION OF THE DRAWINGS

FIGS. 6A-6C are front elevation, bottom end elevation, and right side elevation views, respectively, that illustrate a second alternate embodiment of the face pack locking structure.

FIGS. 7A-7C are front elevation, bottom end elevation, and right side elevation views, respectively, that illustrate another embodiment of the face pack using locking features formed into the pivot pins.

DETAILED DESCRIPTION

Figure 1:
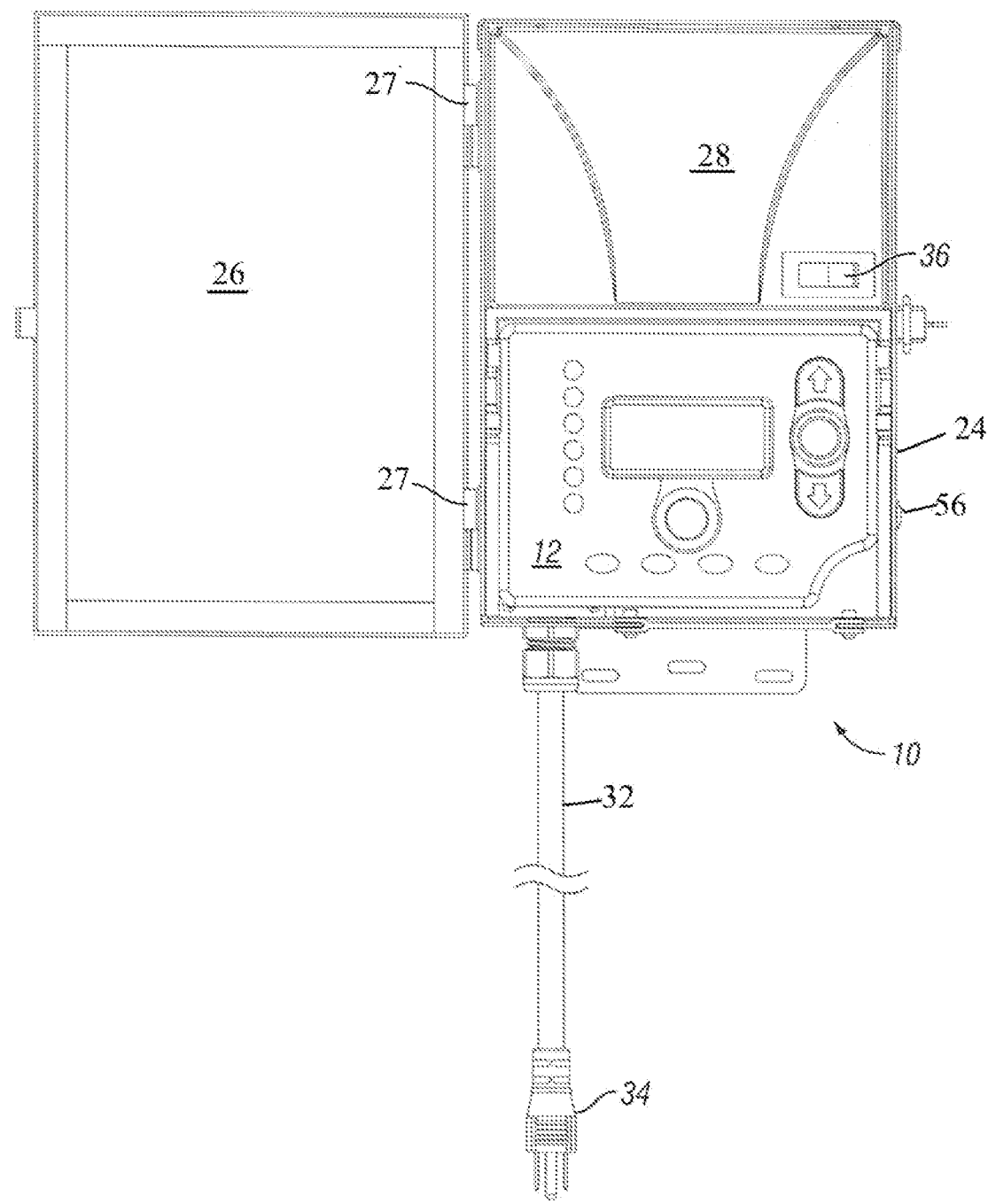
FIG. 1 is a front elevation view of a landscape lighting controller in accordance with an embodiment of the present invention. In this view the front door of the controller is open to reveal its removable face pack in its normal vertical use position.

In accordance with an embodiment of the present invention, a landscape lighting controller 10 (FIG. 1) includes a control panel in the form of a removable face pack 12 that encloses and supports digital circuitry for accomplishing various timing, control, and diagnostic features hereafter described. The face pack 12 (FIG. 2) includes an injection molded plastic generally rectangular hollow enclosure 14 inside of which a face pack printed circuit (PC) board (not illustrated) is mounted. A plurality of manually actuable input devices in the form of push buttons 16a-16d are mounted on a front side of the enclosure 14. A liquid crystal display (LCD) 18 is also mounted in the front of the enclosure 14.

A pair of pivot pins 20 (FIG. 2) extend from the opposite ends of the enclosure 14. Two locking pins 22 extend from the opposite ends of the enclosure 14 and are spaced from, and situated below, the pivot pins 20. The pivot pins 20 and the locking pins 22 extend along parallel axes from the opposite ends of the face pack enclosure 14. The pivot pins 20 and the locking pins 22 are preferably integrally molded with the front half of the face pack enclosure 14.

The landscape lighting controller 10 further includes a generally rectangular box-like protective outer housing comprised of a rear portion 24 (FIG. 1) and a front door 26 that is mounted via a vertical hinge assembly 27 to a left side of the rear housing portion 24. The door 26 can be swung shut to seal off the outward opening of the rear housing portion 24. The rear housing portion 24 and the front door 26 are both preferably made of sheet metal. The rear housing portion 24 defines an interior sufficiently large to enclose the face pack 12 in a lower half thereof. The upper half of the interior of the rear housing portion 24 encloses a power transformer 30

Figure 2:
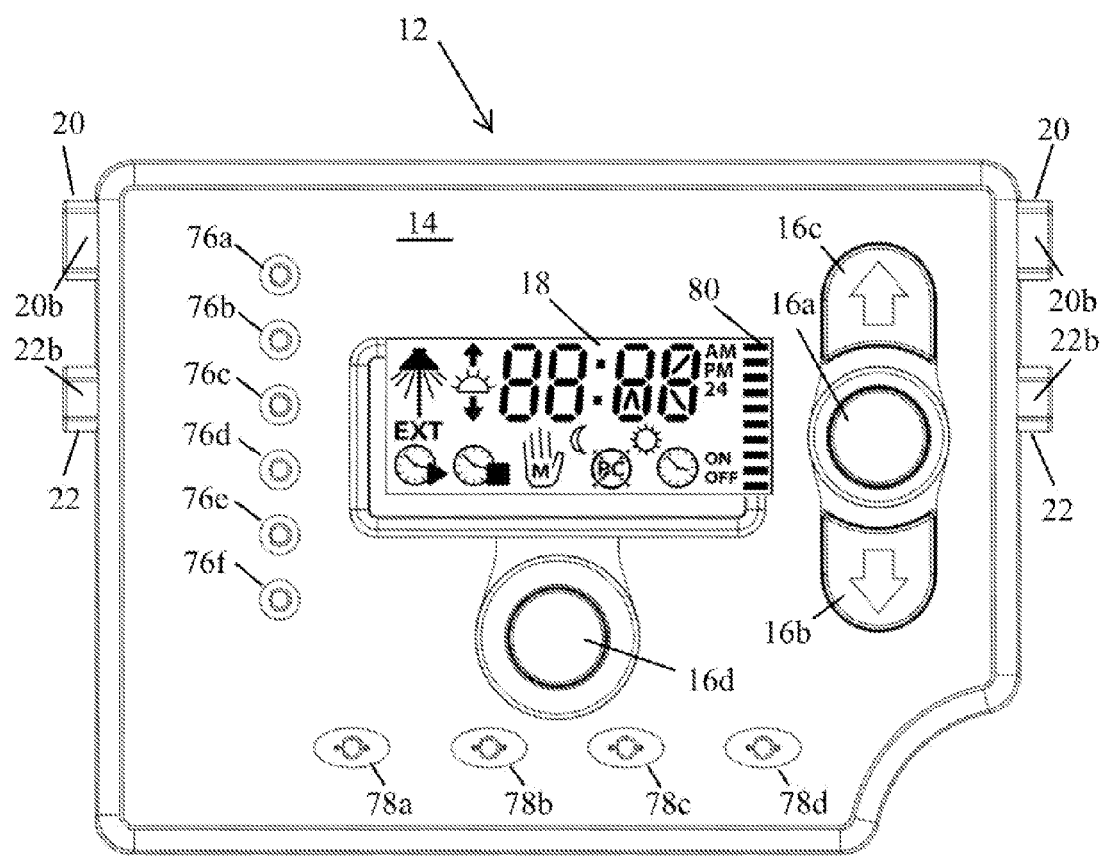
FIG. 2 is an enlarged front elevation view of the face pack of the landscape lighting controller of FIG. 1 removed from the outer housing of the controller. Various graphic symbols are illustrated that can be indicated on the display of the face pack.

(FIG. 11) behind a decorative panel 28 (FIG. 1). The primary winding of the power transformer 30 can be connected to an AC power source (not illustrated) such as standard one hundred and twenty volt AC household duplex outlet via a power cord 32 that terminates at its distal end with a standard grounded AC male plug 34. A magnetic circuit breaker (MCB) 36 is mounted in the decorative panel 28. The magnetic circuit breaker 36 includes a rocker switch that is manually accessible to the user to reset the circuit breaker if required. A relay 38 (FIG. 11) connects the incoming AC power to the primary winding of the power transformer 30. The relay 38 is controlled by a microcontroller 50 in response to an operator input requiring the landscape lighting controller 10 to turn ON or OFF, as well as inputs from a current sensor 62, a photocell 56, or other inputs to the microcontroller 50.

A generally rectangular chassis 40 (FIG. 3), which is preferably made of injection molded plastic, is securely attached inside the lower half of the rear housing portion 24. The chassis 40 has a pair of identical inverted L-shaped side walls 40a and 40b that overlie the side walls of the rear housing portion 24. The chassis 40 is molded with a pair of vertically aligned fingers, bearing slots, flexible arms, and lock recesses (not readily visible in FIG. 3). As described and illustrated in detail in the aforementioned co-pending U.S. patent application Ser. No. 13/098,319, the bearing slots and the lock recesses are dimensioned, configured and located within the rear housing portion 24 so that the face pack 12 can be installed in the rear housing portion 24 in a normal upright position (FIG. 1). When the face pack 12 is in its normal upright position illustrated in FIG. 1 the pivot pins 20 are each received in a corresponding one of the bearing slots and the locking pins are each received in a corresponding one of the lock recesses. The bearing slots and the lock recesses are also dimensioned, configured and located within the rear housing portion 24 so that the face pack 12 can be swung upwardly through a predetermined angle to release the locking pins from the lock recesses to allow the face pack 12 to be removed from the rear housing portion 24. The face pack 12 can be placed into a horizontal service position illustrated in FIG. 3 by first rotating the face pack 12 to a horizontal orientation and then sliding both the pivot pins 20 and the locking pins 22 into the bearing slots until the locking structure surfaces 22b are retained between two open surfaces of the bearing slots.

The landscape lighting controller 10 further includes a first multi-pin male electrical connector (not illustrated) mounted in the rear side of the face pack enclosure 14. This connector is mounted on the face pack PC board (not illustrated) inside the face pack enclosure 14 and protrudes through an aperture in the face pack enclosure 14. A second multi-pin male electrical connector 48 (FIG. 3) is mounted in the rear housing portion 24. A ribbon cable (not illustrated) has mating female multi-contact electrical connectors at each end that can be plugged into the multi-pin male electrical connectors to provide power to the face pack 12 and to allow the control circuitry in the face pack 12 to turn light fixtures ON and OFF using the power from the power transformer 30. The face pack 12 can be readily removed from the rear housing portion 24 and the ribbon cable disconnected from the face pack 12. This allows a person to walk around the landscape site with the face pack 12 in hand to enable more convenient and intuitive programming of the ON and OFF times for the light fixtures of the landscape lighting system. The face pack 12 includes a backup power source 49 (FIG. 11) that supplies power to a processor in the form of a microcontroller 50. The backup power source may be a super capacitor to store energy and provide power to the system clock in the event of a power outage. Alternatively, the backup power source 49 may be a battery that supplies power to the processor and power to the LCD 18 when the ribbon cable is disconnected from the face pack 12 to provide power to the system clock and also allow the face pack 12 to be programmed when removed from the rear housing portion 24.

Figure 3:
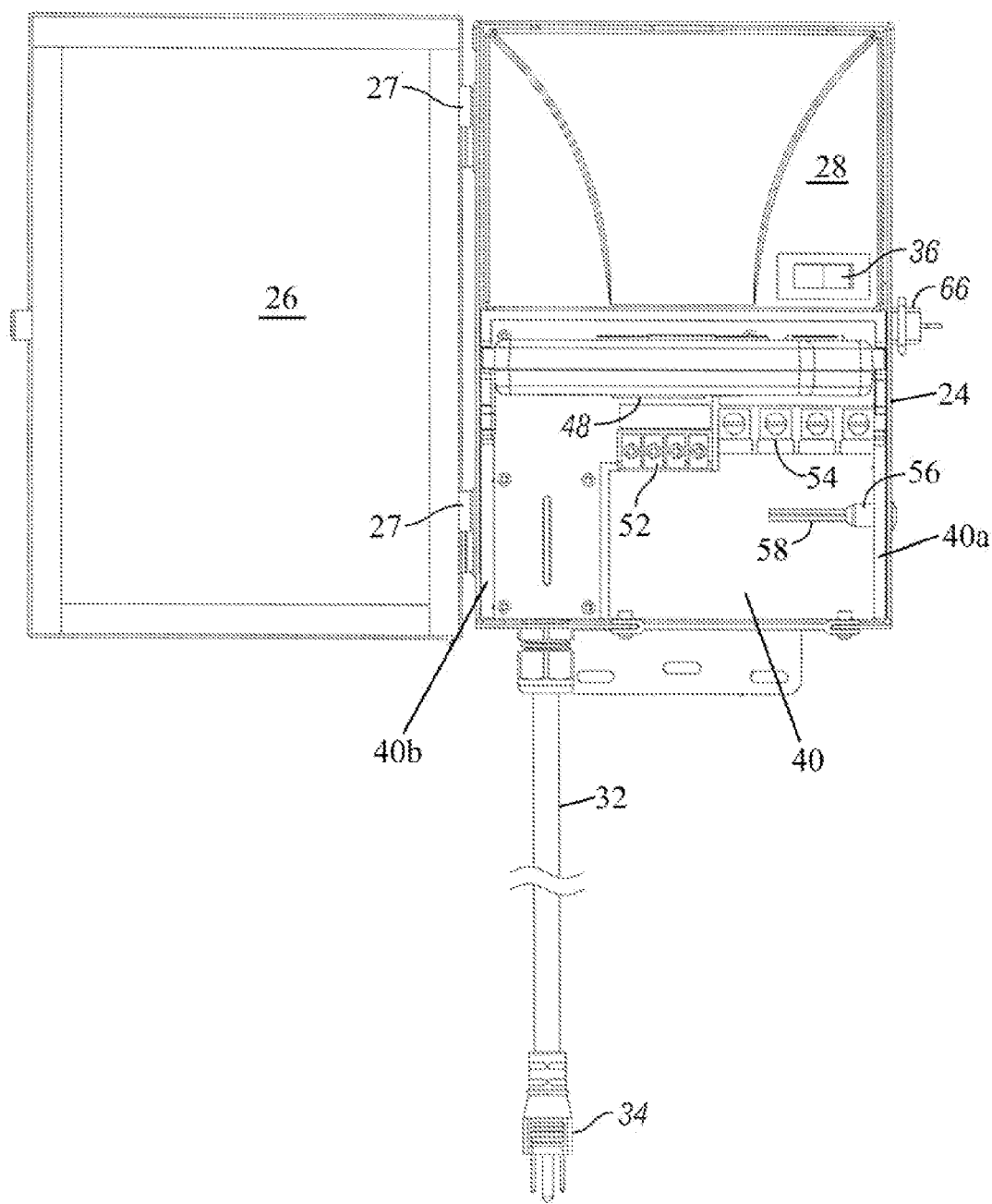
FIG. 3 is a front elevation view of the landscape lighting controller of FIG. 1 after its face pack has been pivoted upwardly and slid rearwardly inside the outer housing of the controller to its horizontal service position to allow access to the wire connection terminals.
Figure 4C:
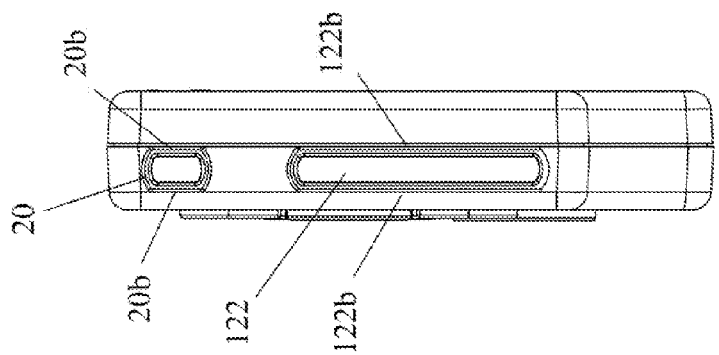
FIGS. 4A-4C are front elevation, bottom end elevation, and right side elevation views, respectively, that illustrate an alternate embodiment of the face pack locking structure.
Figure 4A:
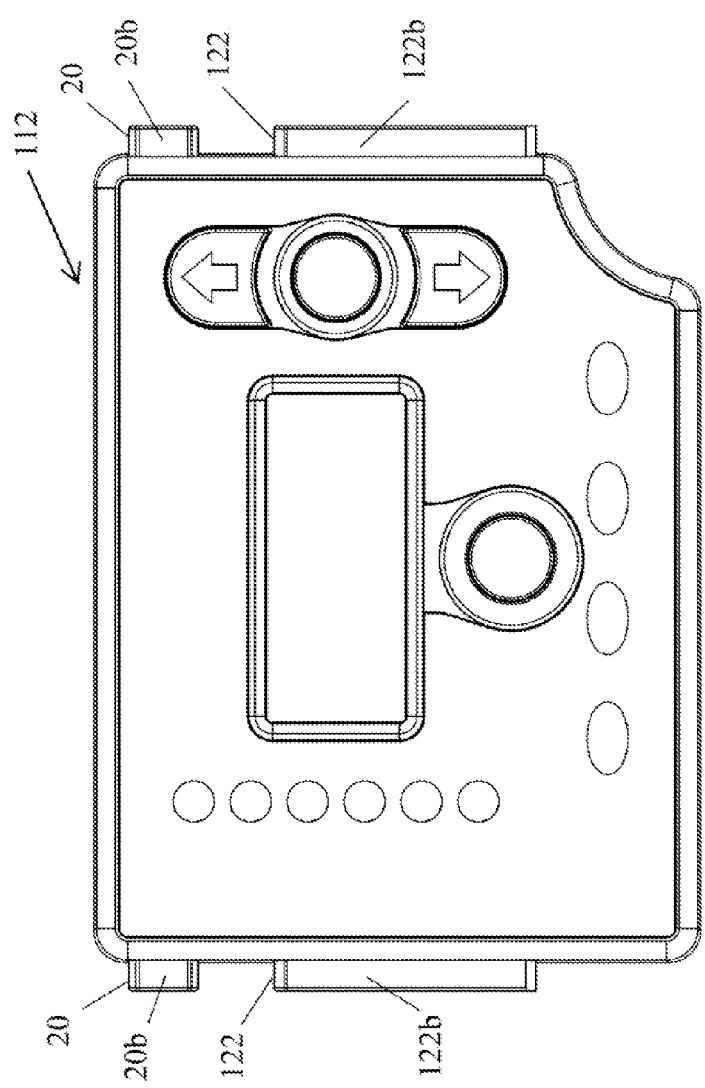
Figure 4B:
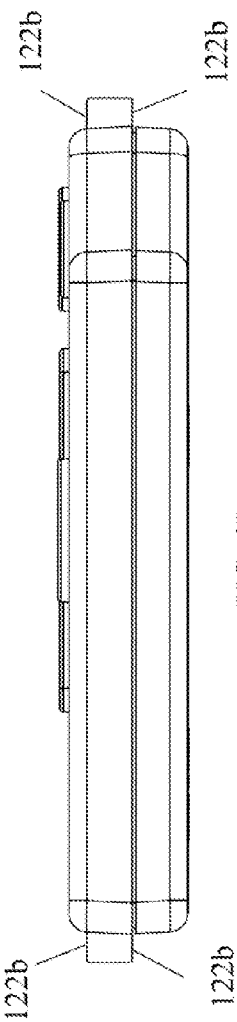
Figure 5:
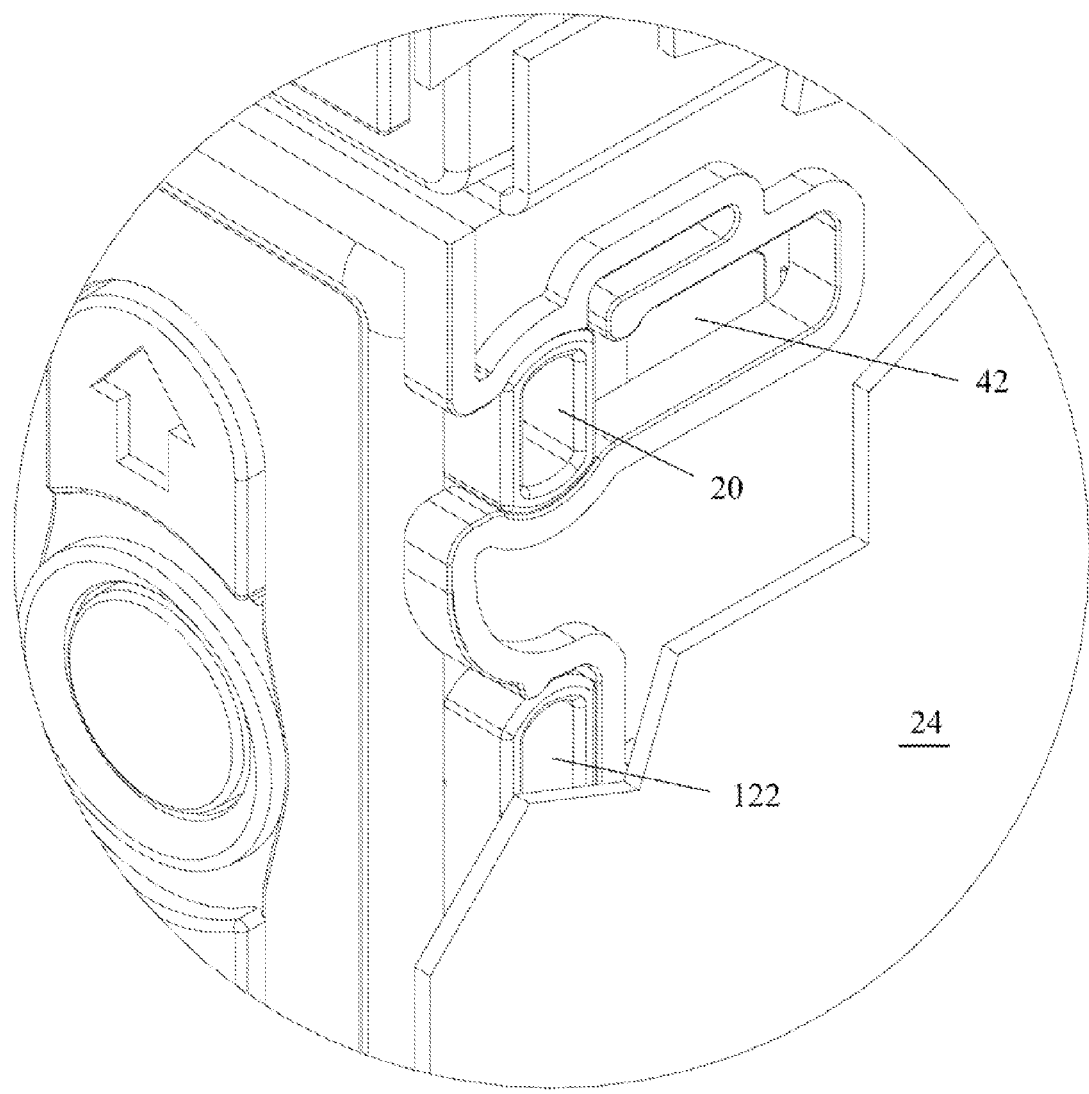
FIG. 5 illustrates the face pack of FIGS. 4A-4C installed in a cut away portion of the rear housing
Figure 11:
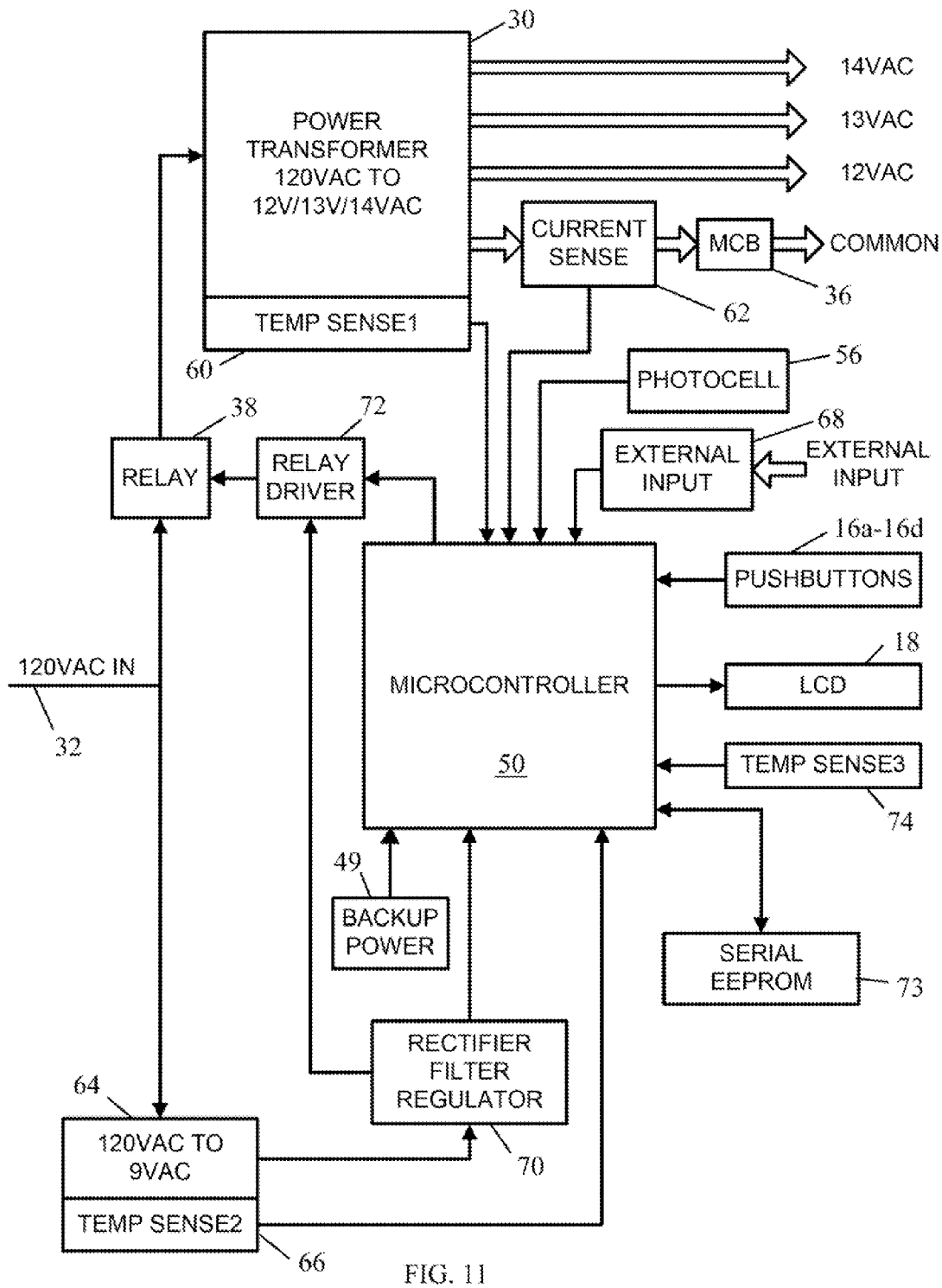
FIG. 11 is a block diagram of the electronic circuitry of the landscape lighting controller of FIG. 1.

The landscape lighting controller 10 includes a first plurality of wire connection terminals 52 (FIG. 3) and a second plurality of screw-type wire connection terminals 54. Both sets of wire connection terminals 52 and 54 are mounted in the chassis 40. The wire connection terminals 52 and 54 are normally concealed behind the face pack 12 when the face pack 12 is installed in the outer housing portion 24 in its normal upright position illustrated in FIG. 1. The wire connection terminals 52 and 54 are accessible by the homeowner or maintenance personnel for manually connecting wires (not illustrated) to the wire connection terminals 52 and 54 when the face pack 12 is in its horizontal service position illustrated in FIG. 3. The terminals 52 can be used to connect wires from various sensors, such as the photocell 56 (FIG. 11). FIG. 3 illustrates a dual-conductor cable 58 connected to the photo cell 56 which is mounted in the right side wall of the rear housing portion 24. The conductors of the dual-conductor cable 58 are connected to the terminals 52. The remaining terminals 52 provide auxiliary inputs to allow another device to turn ON the lights if desired. The other wire connection terminals 54 are used to attach wires that lead to the light fixtures (not illustrated). One of the wire connection terminals 54 also provides a common return connection. The wire connection terminals 52 and 54 can be screw-type terminals as illustrated, lever actuated terminals, mating plugs, terminals that pinch the stripped ends of insulated wires, and any other wire connection terminals commonly found in consumer electronics devices such as home audio systems.

The light fixtures (not illustrated) can include incandescent bulbs. Examples of suitable landscape light fixtures are disclosed in U.S. Pat. No. 6,784,905 granted Apr. 5, 2005 to Joshua Z. Beadle and U.S. Pat. No. 7,387,409 granted Jun. 17, 2008 to Joshua Z. Beadle. Alternatively, the light fixtures can incorporate LEDs in which case each light fixture includes a rectifier circuit for changing the AC signal to a DC signal. See, for example, published U.S. Patent Application Pub. No. 2010/0084985 A1 of Peter J. Woytowitz published Apr. 8, 2010 and entitled "Low Voltage Outdoor Lighting Power Source and Control System", also assigned to Hunter Industries, Inc., the entire disclosure of which is hereby incorporated by reference.

Further details of the electro-mechanical construction of the landscape lighting controller 10 can be found in the aforementioned co-pending U.S. patent application Ser. No. 13/098,319 filed Apr. 29, 2011 by Darrin I. Schmuckle and entitled "Landscape Controller Housing with Pivotable Locking Face Pack."

An alternative locking support structure 122 (FIGS. 4A-4C and 5) can take the form of an elongated protrusion formed in the sides of the face pack 112. The face pack 112 is similar to the face pack 12 except for the shape of the locking structure. The locking support structure 122 includes surfaces 122b configured to slide between two open surfaces that form the forward most portion of the bearing slot 42 and add support to the face pack 122 when in its horizontal service position.

Referring to FIG. 6A, an alternate form of the face pack 132 is formed with a locking support structure 322 with opposing surfaces 322b that slide in between the two surfaces that form the forwardmost portion of the bearing slot 42. This configuration adds support to the face pack 322 when it placed in its horizontal service position. This configuration also allows the face pack 312 to hang freely by gravity when placed in its normal vertical use position. Alternatively, any known latch, including magnetic and mechanical latches or locks may be incorporated into the landscape lighting controller 10 to secure the face pack 142 in its normal vertical use position. This can include a key lock to limit access to the wiring areas to authorized personnel.

A third alternative face pack 412 (FIGS. 7A-7C) includes pivot pins 20 but does not include any additional support structures to hold the face pack 412 in its horizontal service position. This configuration uses the flat surfaces 20b of the pivot pins 20 to hold the face pack 132 in a generally horizontal position when the face pack 412 is slid into the bearing slots 42. This embodiment also allows the face pack 412 to hang freely by gravity in its normal vertical use position. Alternatively, any known latch, including magnetic and mechanical latches or locks may be incorporated into the landscape lighting controller 10 to secure the face pack 412 in its normal vertical use position. This can include a key lock to limit access to the wiring areas to authorized personnel.

Figure 8:
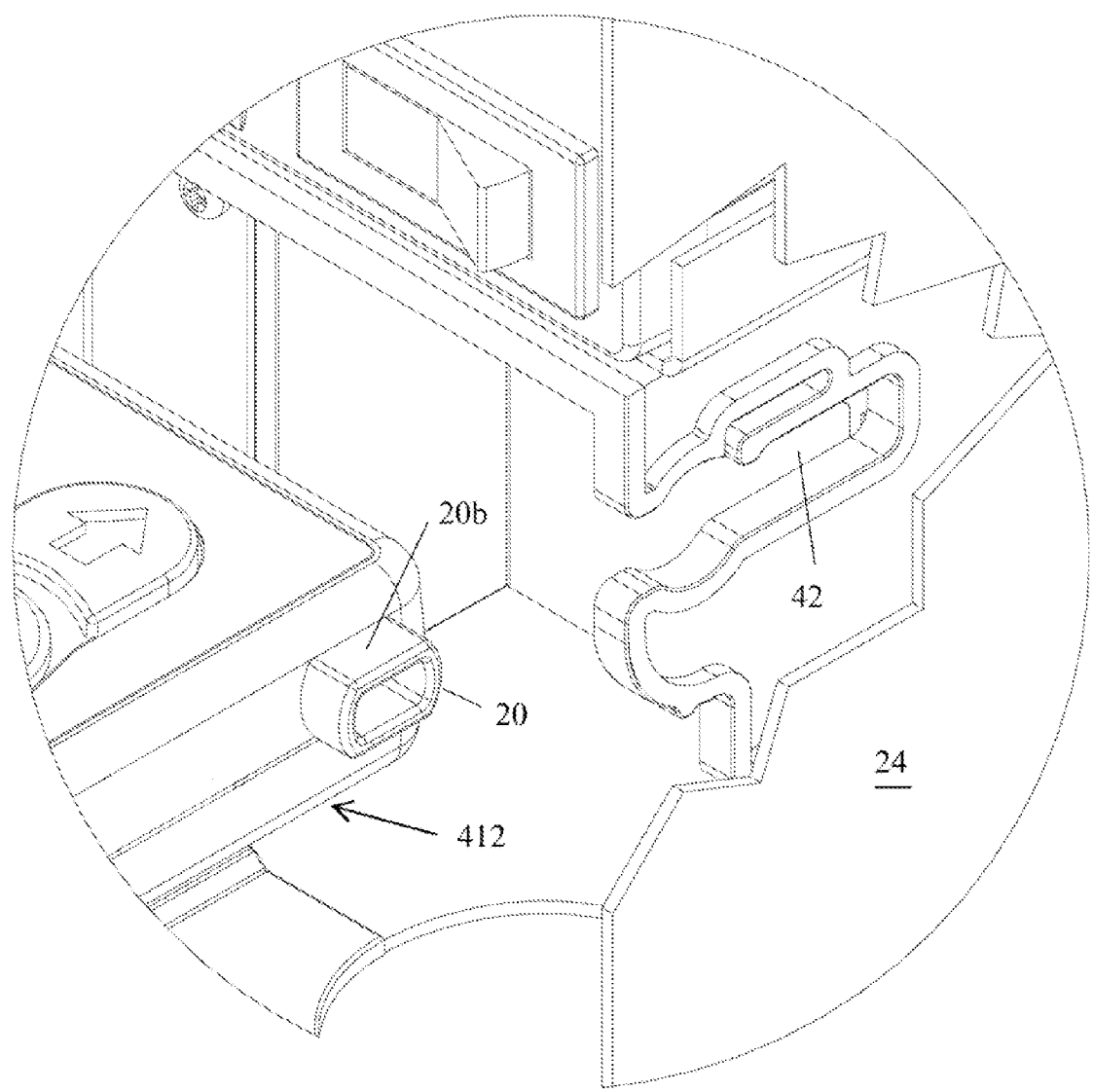
FIG. 8 is a fragmentary view that illustrates the face pack of FIG. 7A removed from the rear housing.
Figure 9:
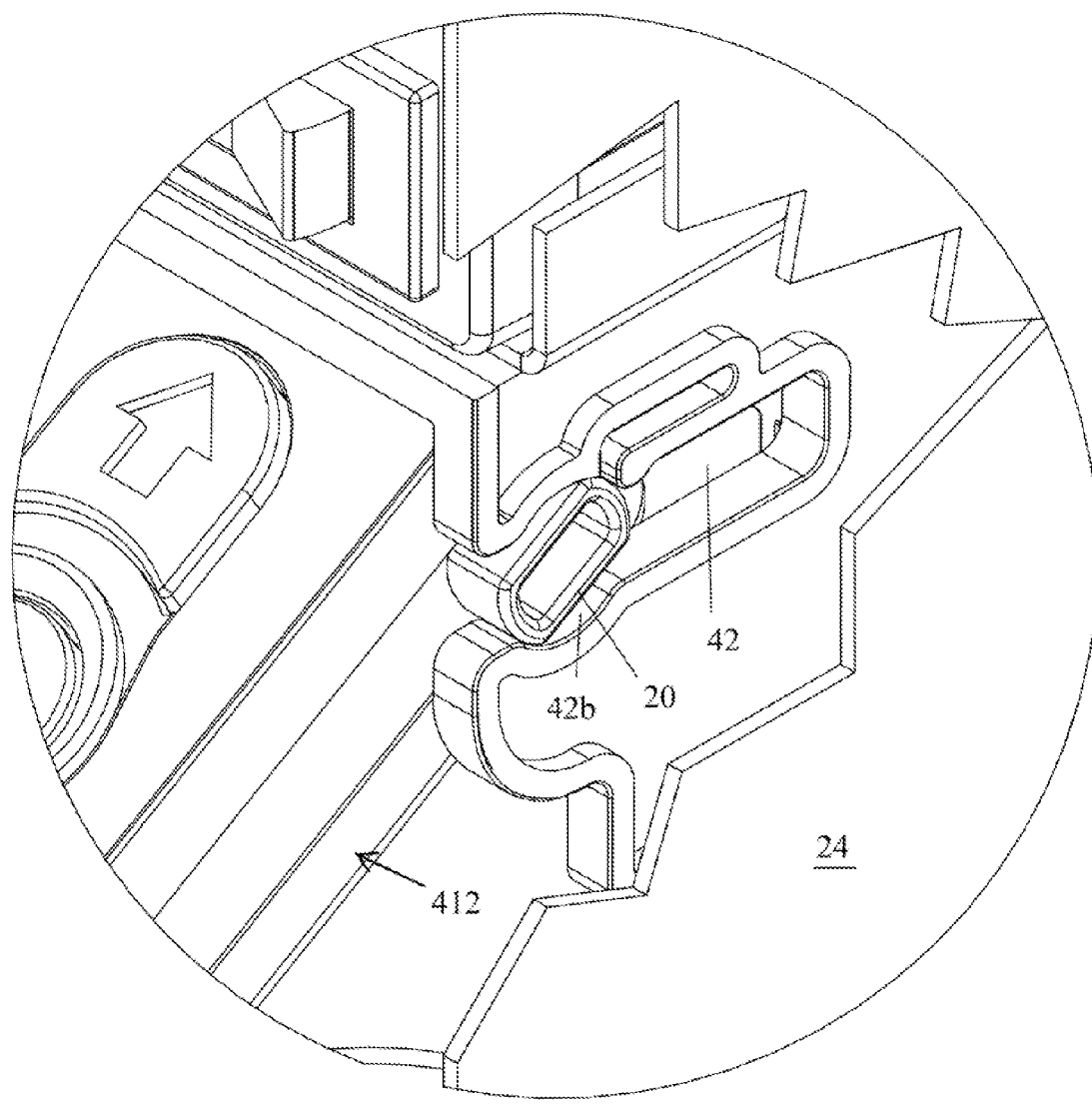
FIG. 9 is a fragmentary view that illustrates the face pack of FIG. 7A installed in the rear housing in a partially pivoted position.
Figure 10:
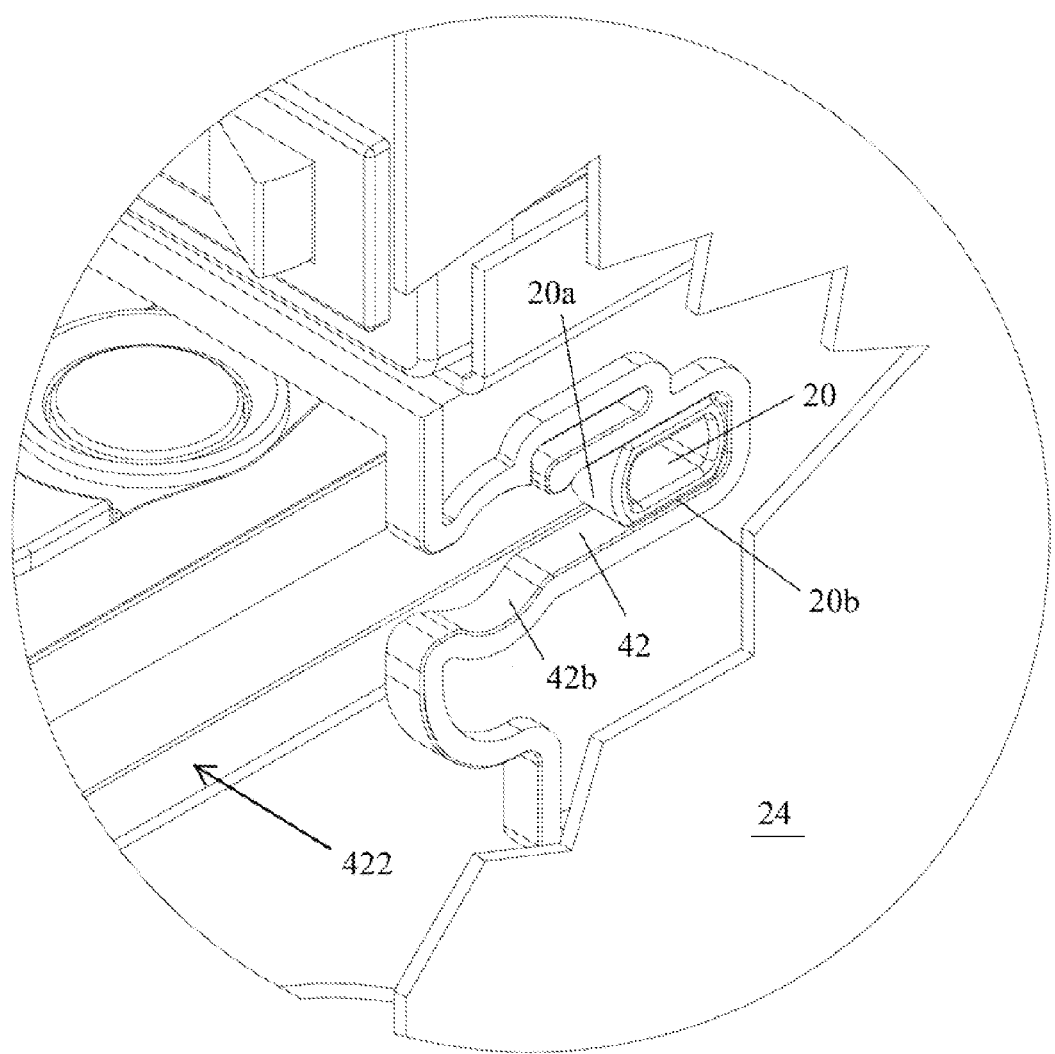
FIG. 10 is a fragmentary view that illustrates the face pack of FIG. 7A installed in the rear housing in its horizontal service position.

FIGS. 8-10 illustrate the face pack 412 relative to the bearing support slot 42 inside the rear housing portion 24. FIG. 8 illustrates the face pack 412 in a near horizontal position and removed from the rear housing portion 24. FIG. 9 illustrates the face pack 412 installed in the rear housing portion 24 and pivoted at an angle on the pivot pins 20 relative to the bearing surfaces 42b. FIG. 10 illustrates the face pack 412 in its horizontal service position. The face pack 412 has been rotated to a horizontal position and then pushed rearwardly into the bearing slots 42. The flat surfaces 20b of the pivot pins 20 are located to allow the face pack 412 to slide in the bearing slots 42. The bearing pins 20 are formed with arched surfaces 20a at a larger distance from each other than the flat surfaces 20b are spaced form each other. The resulting squeezing force allows the pivot pins 20 to rotate with the bearing surfaces 42b while also holding the face pack 422 in a generally horizontal position when pushed rearwardly into the bearing slot 42.

Referring to the block diagram of FIG. 11, the electronic architecture of the landscape lighting controller 10 comprises three main groups of functional components, namely: a) the components mounted on the chassis 40; b) the components mounted on a power control PC board (not illustrated) located inside the upper half of the rear housing portion 24; and c) the components mounted on the face pack PC board (not illustrated) located inside the enclosure 14.

The power transformer 30 (FIG. 11) is firmly mounted to the upper half of the rear housing portion 24 directly behind the access panel 28. The power transformer 30 has a 120 VAC input and three secondary winding taps of 12 VAC, 13 VAC, and 14 VAC. The power transformer 30 supplies low voltage AC power to the landscape light fixtures (not illustrated) of the landscape lighting system that are connected to the landscape lighting controller 10. The multiple secondary winding taps of the power transformer 30 allow for the user to select a slightly higher voltage (than the nominal 12 VAC) compensating for voltage drops that may occur due to long wire runs to the landscape light fixtures. The power transformer 30 has a first temperature sensor 60, such as a thermistor (Vishay PN NTCLE100E3103JB0 or equivalent) in contact with its windings (not illustrated). The temperature sensor 60 is used to sense the temperature of the windings of the power transformer 30 to prevent overheating of the power transformer 30 and resulting damage to its structure. The current sensor 62 is connected to the power transformer. The current sensor 62 may be a current sense transformer (Vitec PN 57PR1831 or equivalent), which senses the amount of current flowing though the common secondary lead of the power transformer 30. Based on the turns ratio of the power transformer 30, a smaller but proportional current is induced in the current sense transformer (e.g. 1/1000 of the current being sensed). A burden resistor (not illustrated) is then added to the output of the current sensor 62 which changes this output current into a voltage which can be read via an A/D input of the microcontroller 50. Various other current sense approaches could be used such as a current sense resistor, or a Hall Effect sensor. The current measured in the common lead of the power transformer 30 represents the total amount of current flowing to all of the landscape light fixtures connected to the landscape lighting controller 10. The photocell 56 is connected to the microcontroller 50. The photocell 56 is mounted on the chassis 40 and protrudes through an aperture in the rear housing portion 24 so that it can sense the level of ambient light.

The purpose of the components of the power control PC board, which is located on the chassis 40 in the lower half of the rear housing portion 24, is to switch power ON and OFF to the power transformer 30 via the relay 38 (FIG. 11). The relay 38 may be a Panasonic PN J1S-B-9V or equivalent. The relay 38 provides a switching device that can be closed and opened to connect and disconnect the primary winding of the power transformer 30 to a source of AC power. The power control PC board also carries a small 120 VAC to 9 VAC step-down transformer 64 that is always energized and provides power for the logic and control circuitry inside the face pack 12. A second temperature sensor 66, which may also be a thermistor, is mounted on the power control PC board, to sense the ambient temperature near the relay 38 and the small transformer 64. An external input 68 allows an external signal from three to thirty volts, AC or DC, to turn the landscape lighting controller 10 ON. The external input 68 is useful when slaving multiple landscape lighting controllers to a master landscape lighting controller.

The face pack PC board inside the enclosure 14 supports a rectifier/filter/regulator circuit 70 that may be made up of four DL4007 diodes, filter capacitors, and a 3.3V regulator (for example Microchip Technology PN MCP1703-3302 or equivalent). These components rectify, filter and regulate the incoming 9 VAC, and create a 3.3 VDC supply suitable for powering the logic circuits inside the face pack 12. The rectifier/filter/regulator circuit 70 supplies power to the microcontroller 50 (Samsung S3F8289 or equivalent) and a relay driver circuit 72. The relay driver circuit 72 may include a pair of transistors (MMBT3904 and MMBT3906 or equivalent). The microcontroller 50 can energize the relay 38 mounted on the power control PC board via the relay driver circuit 72. The microcontroller 50 is also connected to the set of pushbuttons 16a-16d, and the LCD 18 (FIG. 2) which is preferably a custom glass LCD. Together the pushbuttons 16a-16d and the LCD 18 provide a graphic user interface (GUI). A memory 73 is connected to the microcontroller 50 (e.g. serial EEPROM from Microchip Technology PN 93LC66 or equivalent) and is used to store schedule information that the user enters. The microcontroller 50 and memory 73 could be replaced with a single microcomputer chip having its own on-chip memory. All that is needed is some form of a processor and memory for executing a stored operational program regardless of where the inputted schedule information is stored on the face pack PC board. A third temperature sensor 74 is mounted on the face pack PC board inside the enclosure 14 and senses ambient temperature inside the face pack 12. This third temperature sensor 74 is in addition to the first temperature sensor 60 mounted adjacent the windings of the power transformer 30, and the second temperature sensor 66 on the power control PC board, all of which are read by the microcontroller 50.

The external input 68 on the power control PC board is also routed to the face pack 12 where it is optically isolated by a dual polarity optocoupler (e.g. Fairchild PN FOD814 or equivalent). The optocoupler is not illustrated in FIG. 11. The optocoupler can accept either AC or DC. Optical isolation is important to eliminate ground loops between the landscape lighting controller 10 and the device driving the external input 68.

Programming Capabilities

Figure 12A:
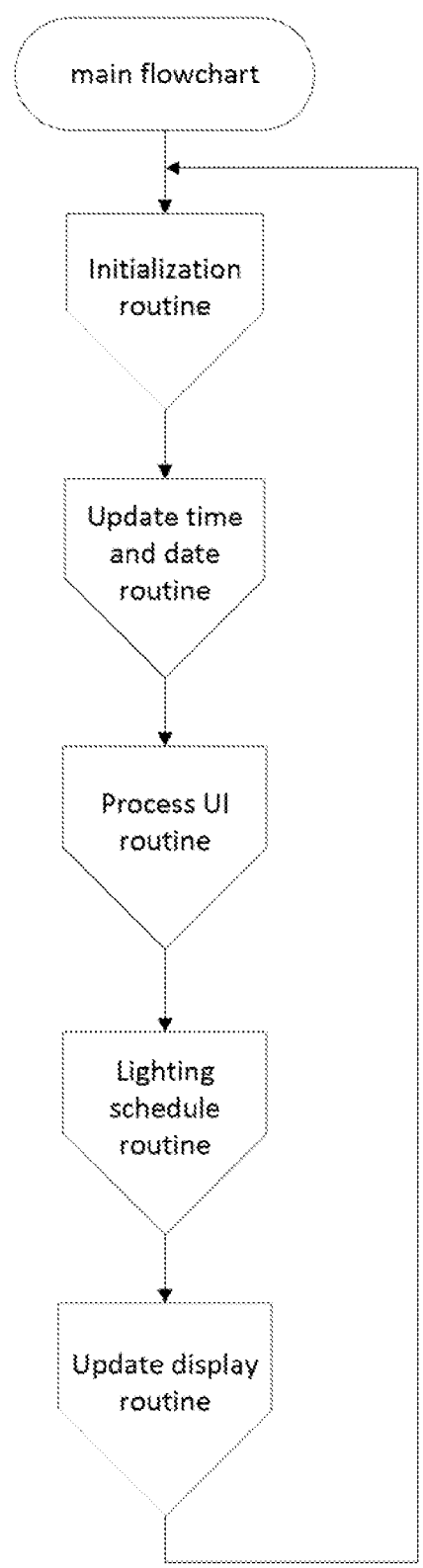
FIGS. 12A-12Y taken together comprise a flow chart illustrating the firmware that provides the operational program of the landscape lighting controller of FIG. 1.
Figure 12B:
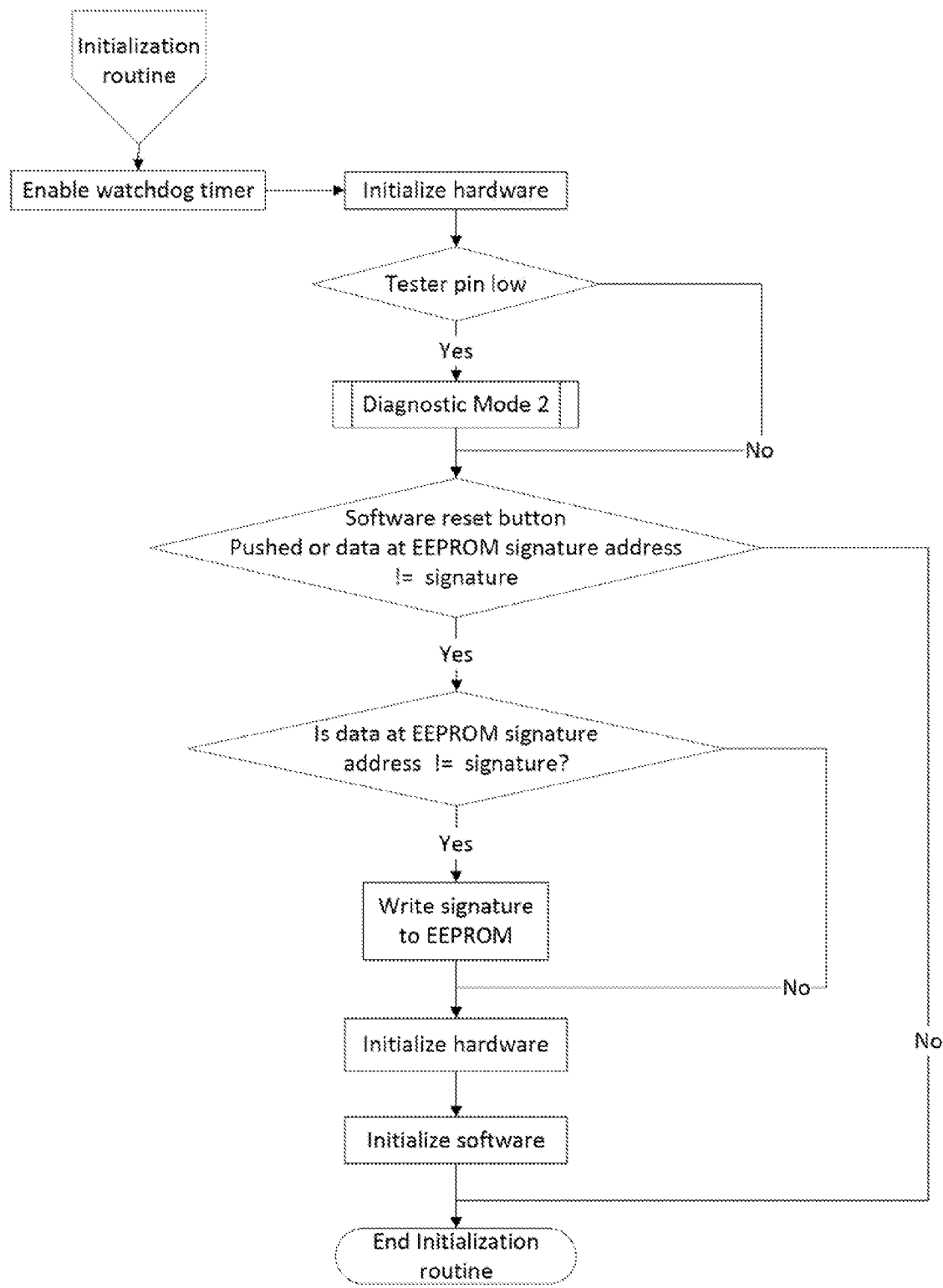
Figure 12C:
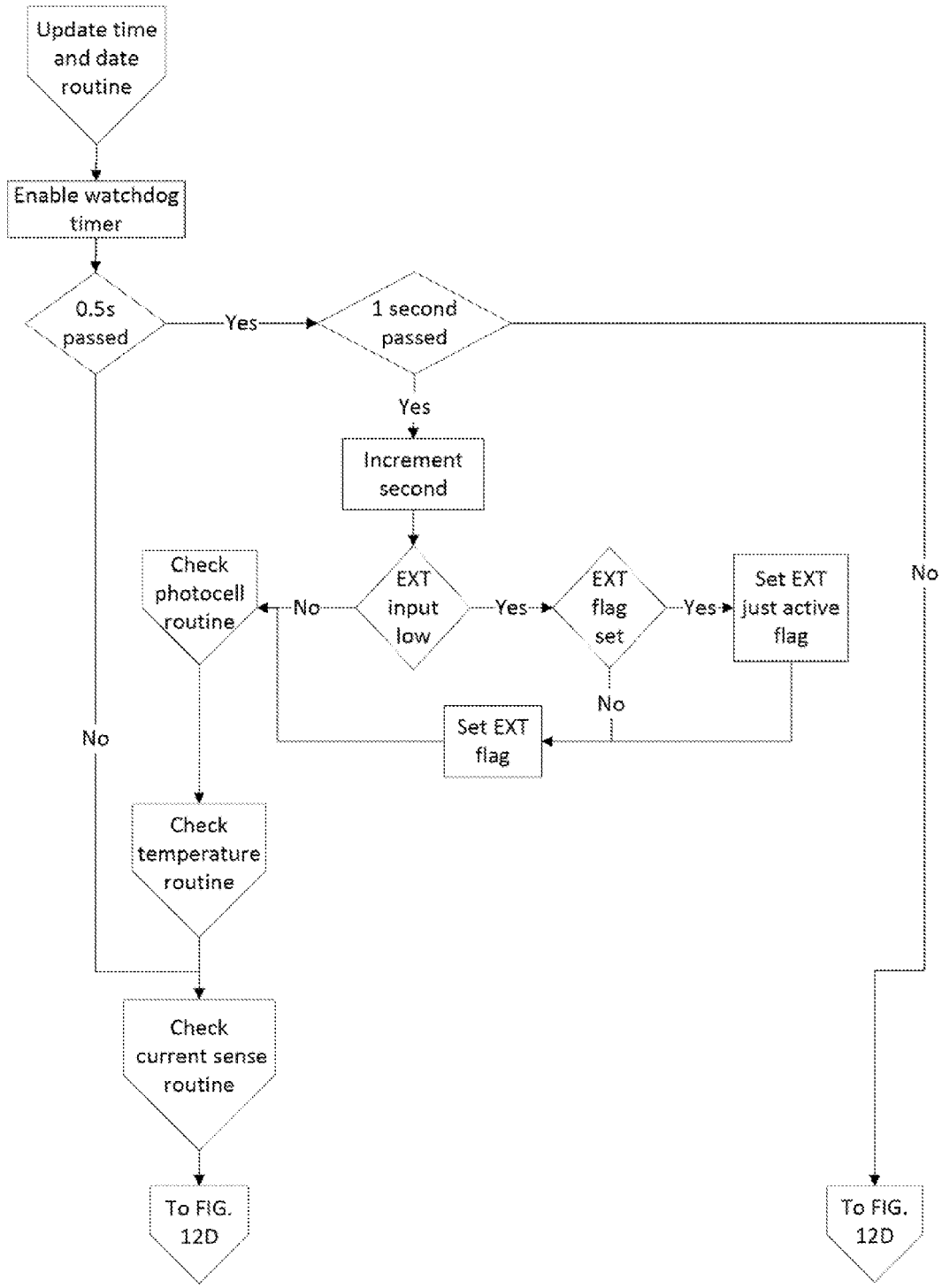
Figure 12D:
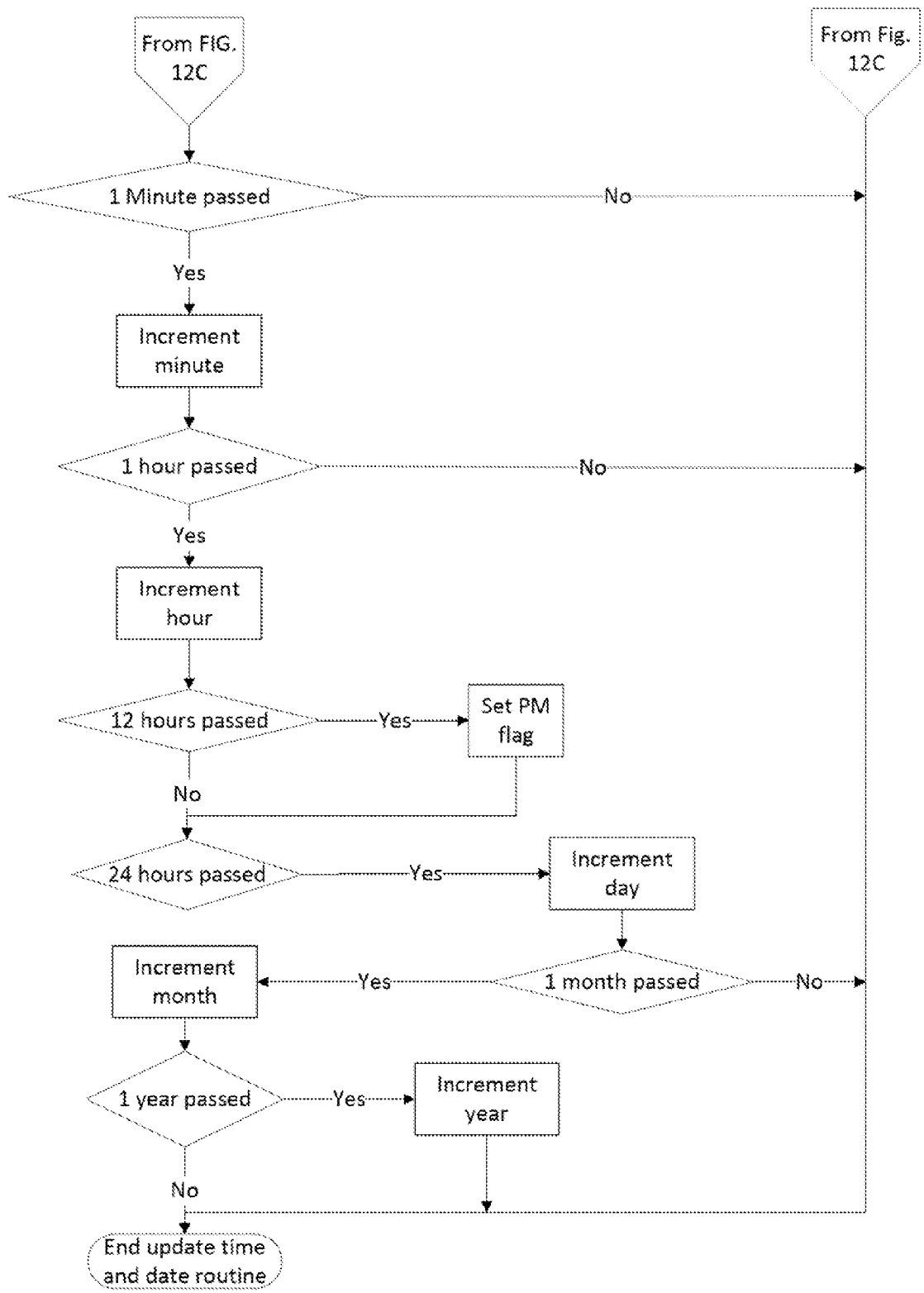
Figure 12E:
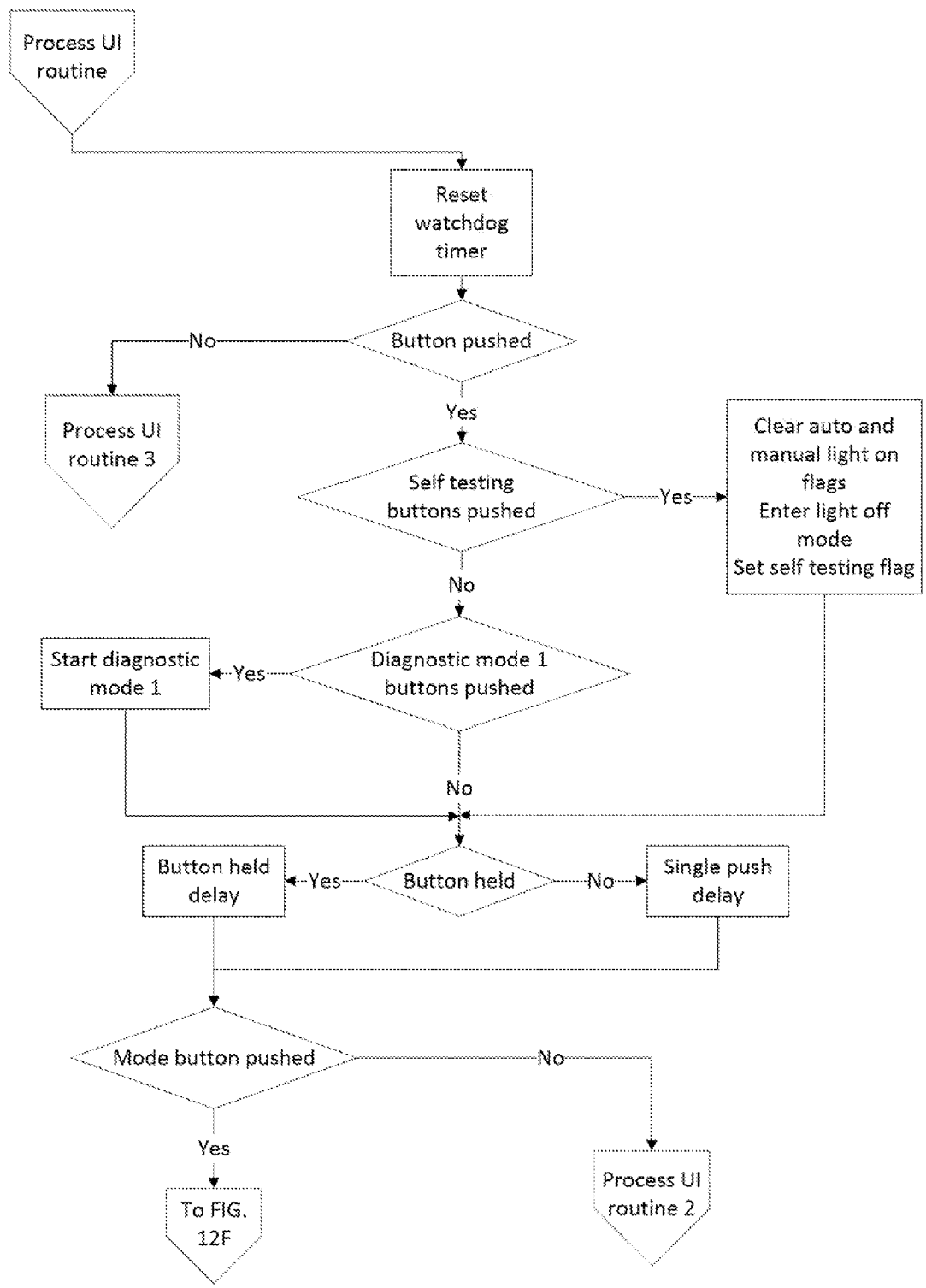
Figure 12F:
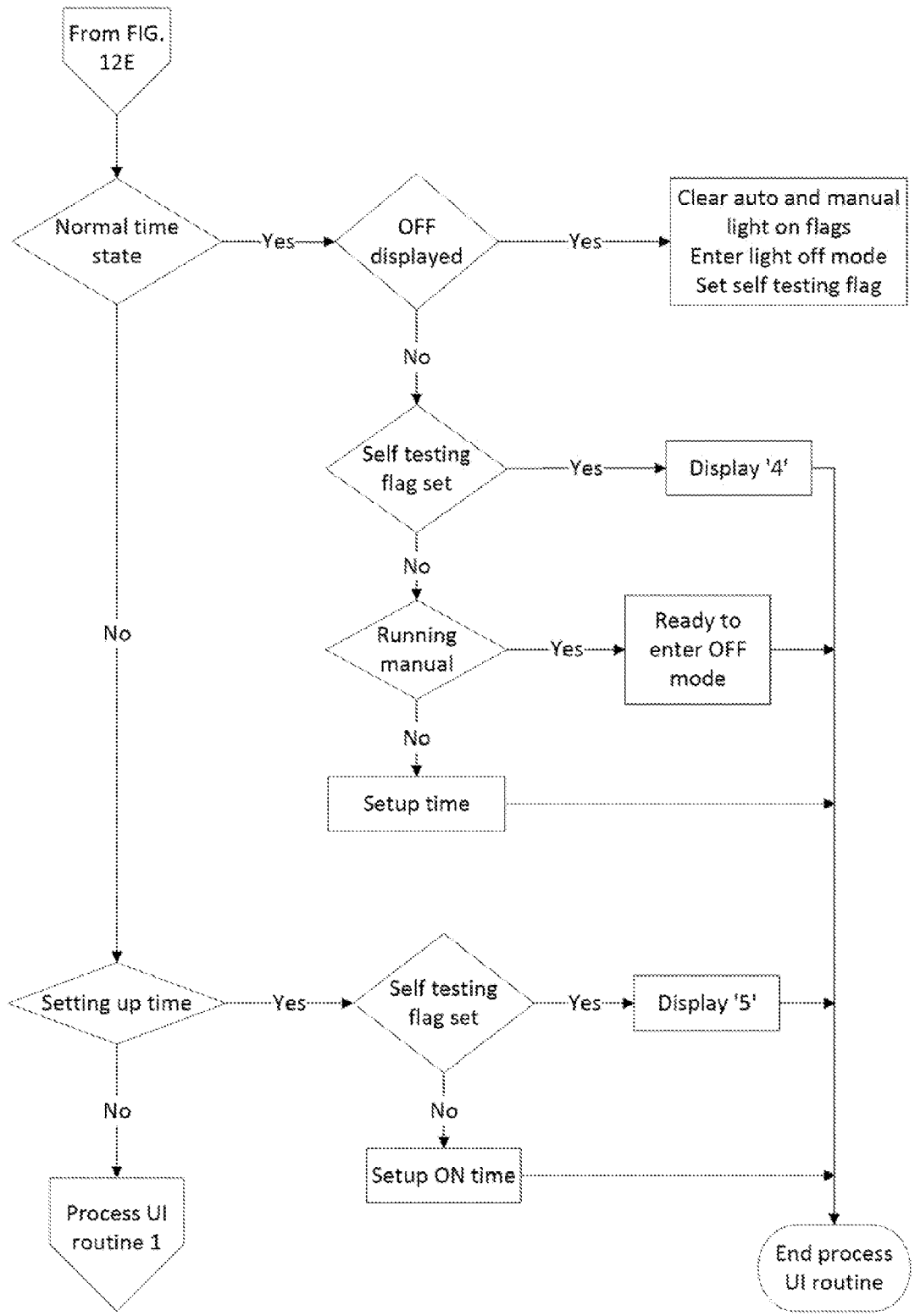
Figure 12G:
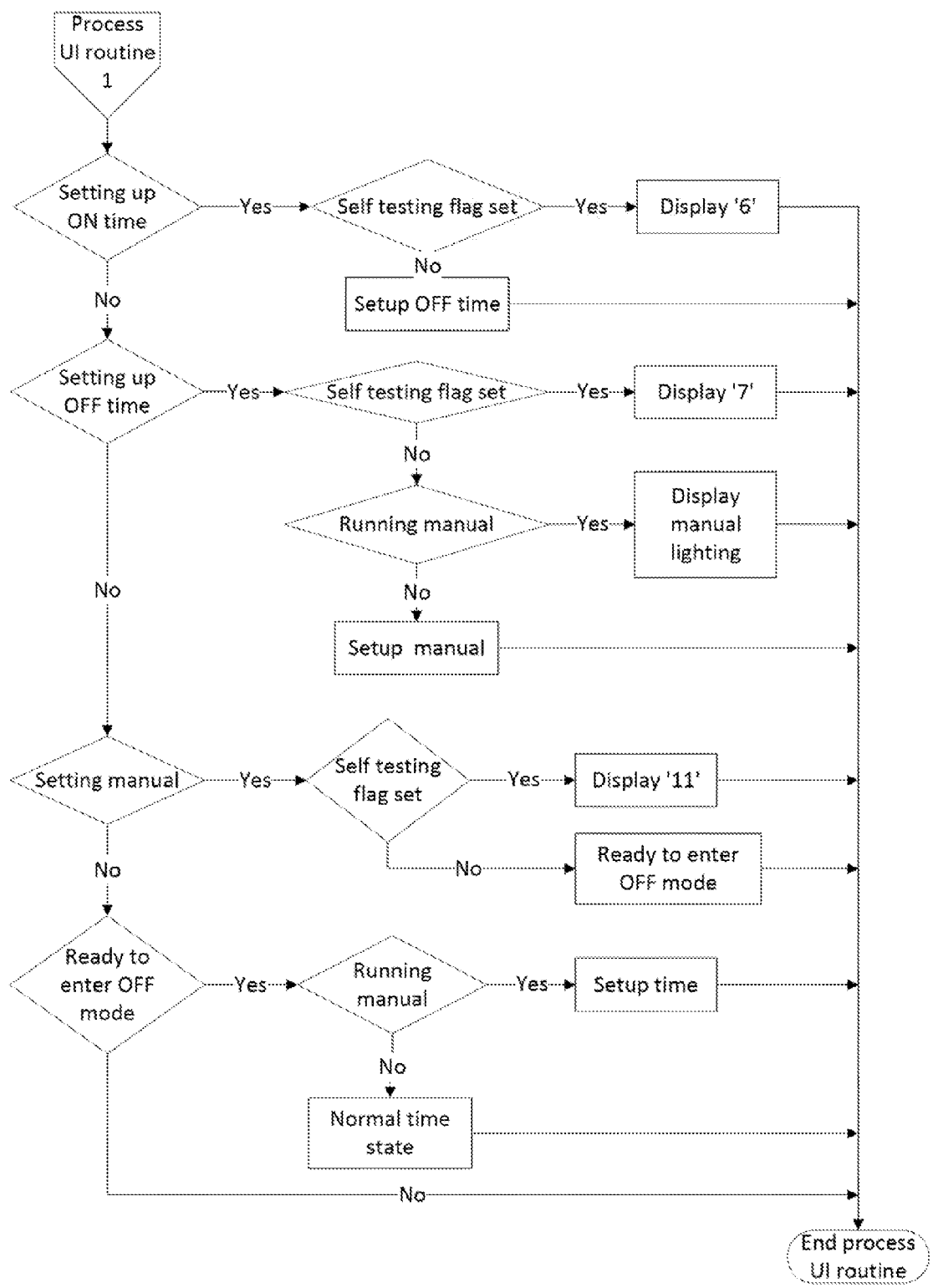
Figure 12H:
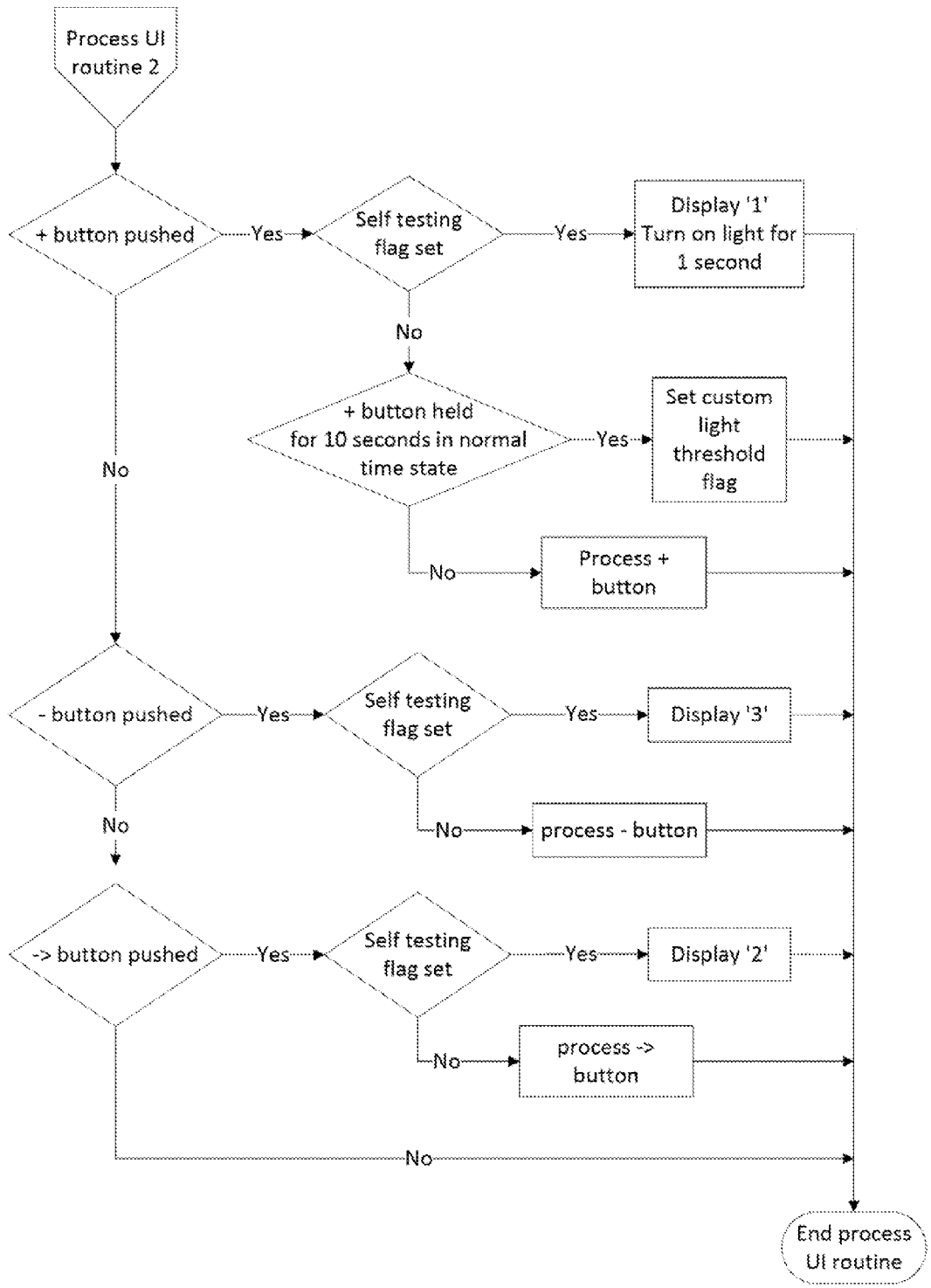
Figure 12I:
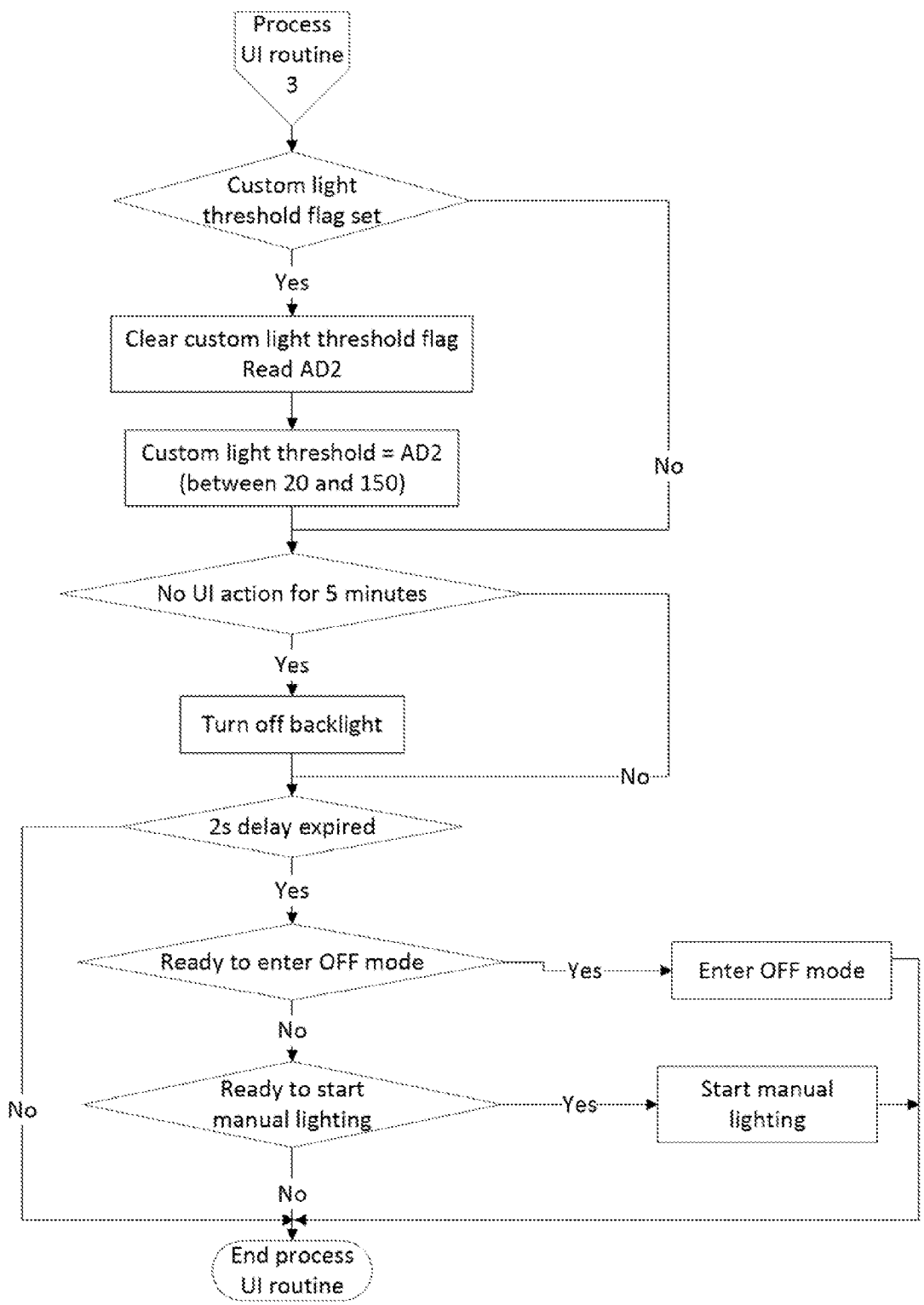
Figure 12J:
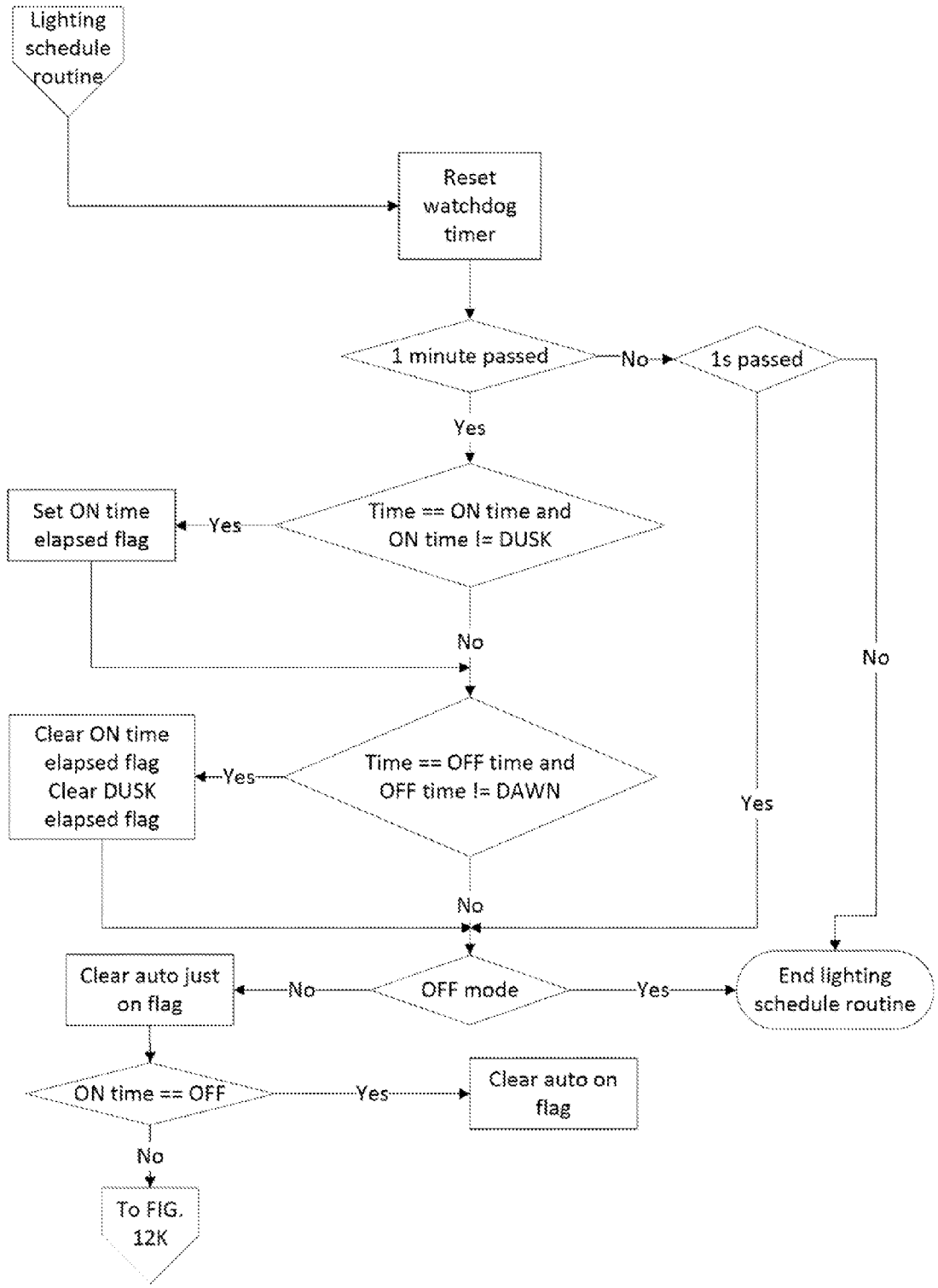
Figure 12K:
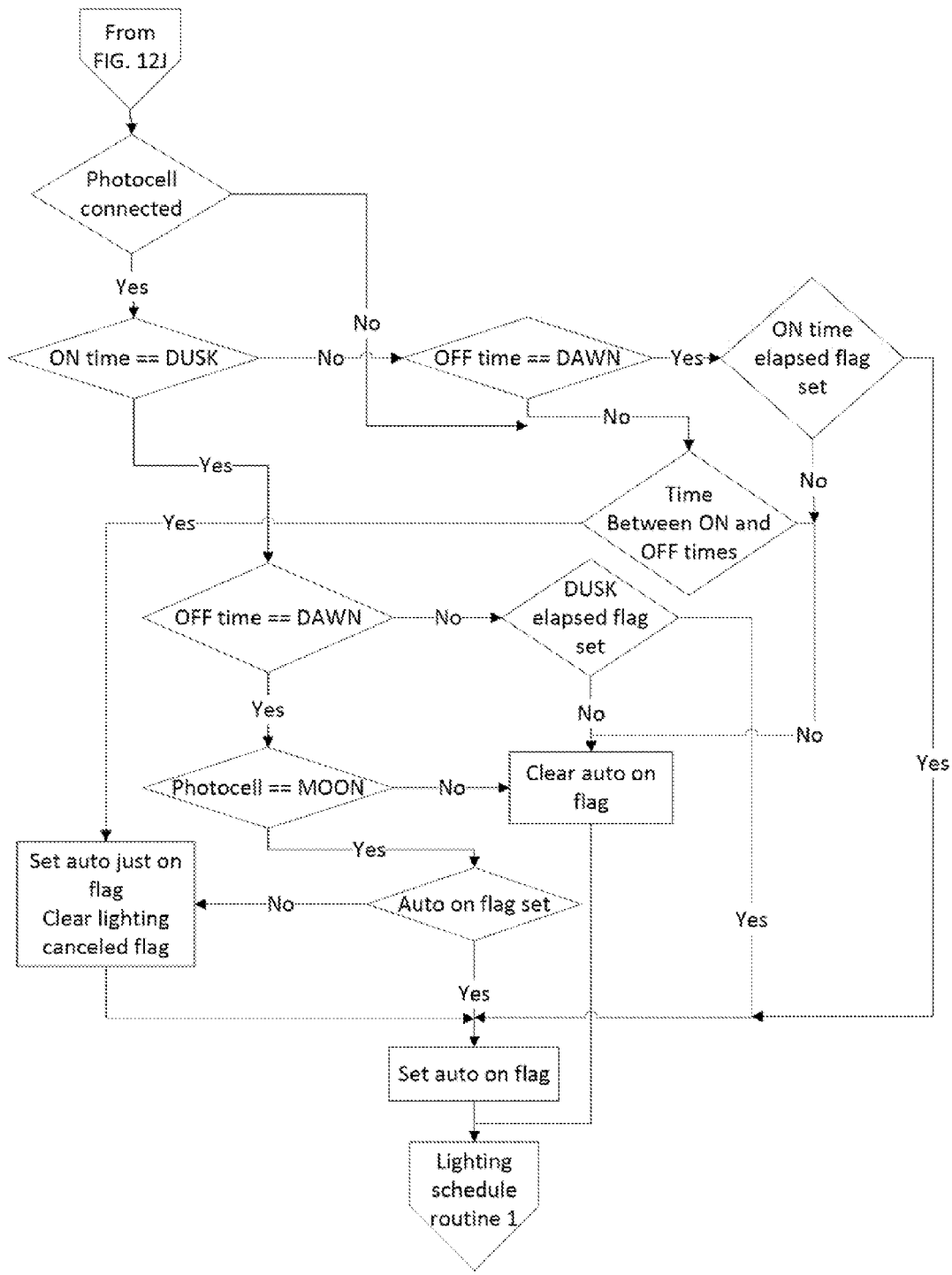
Figure 12L:
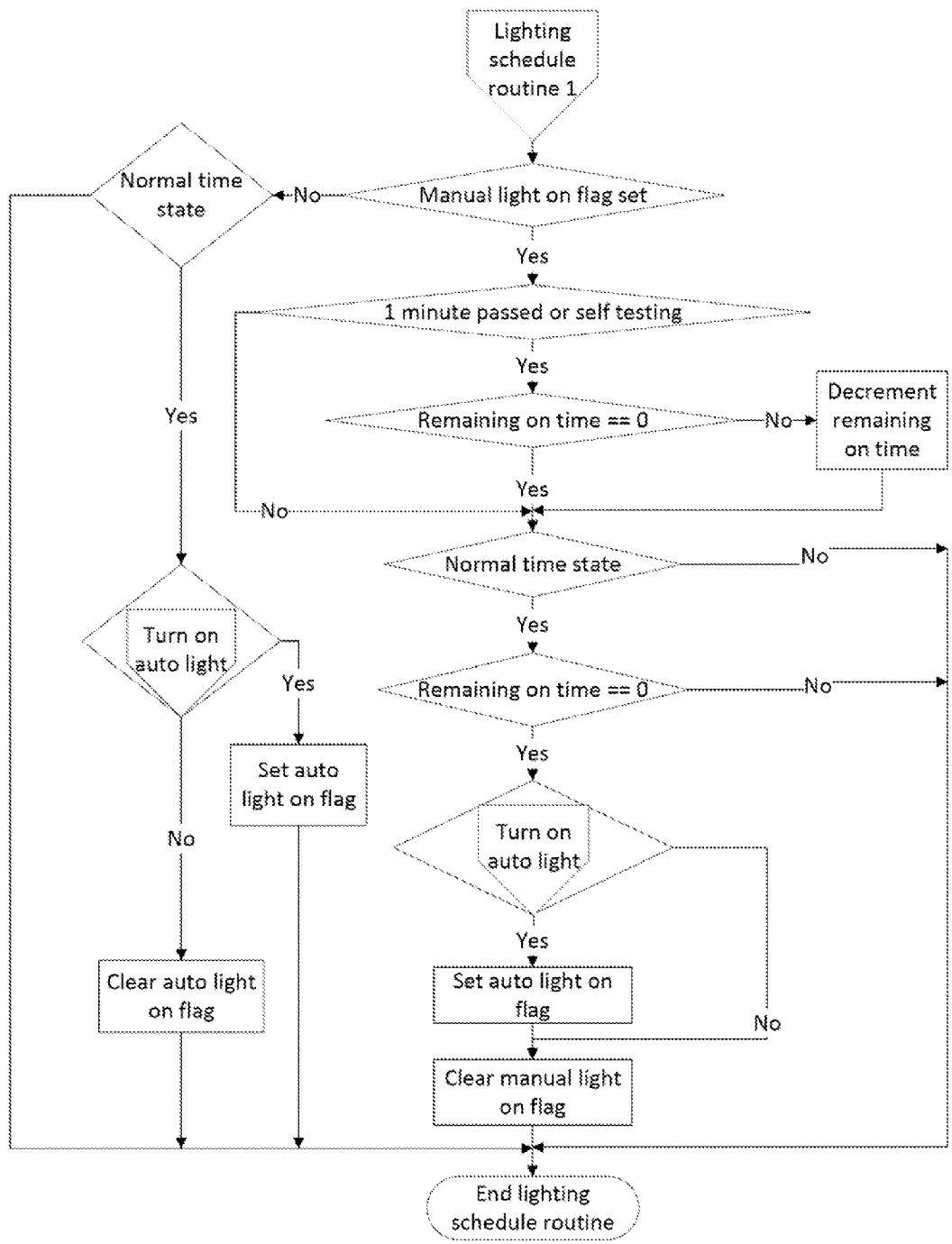
Figure 12M:
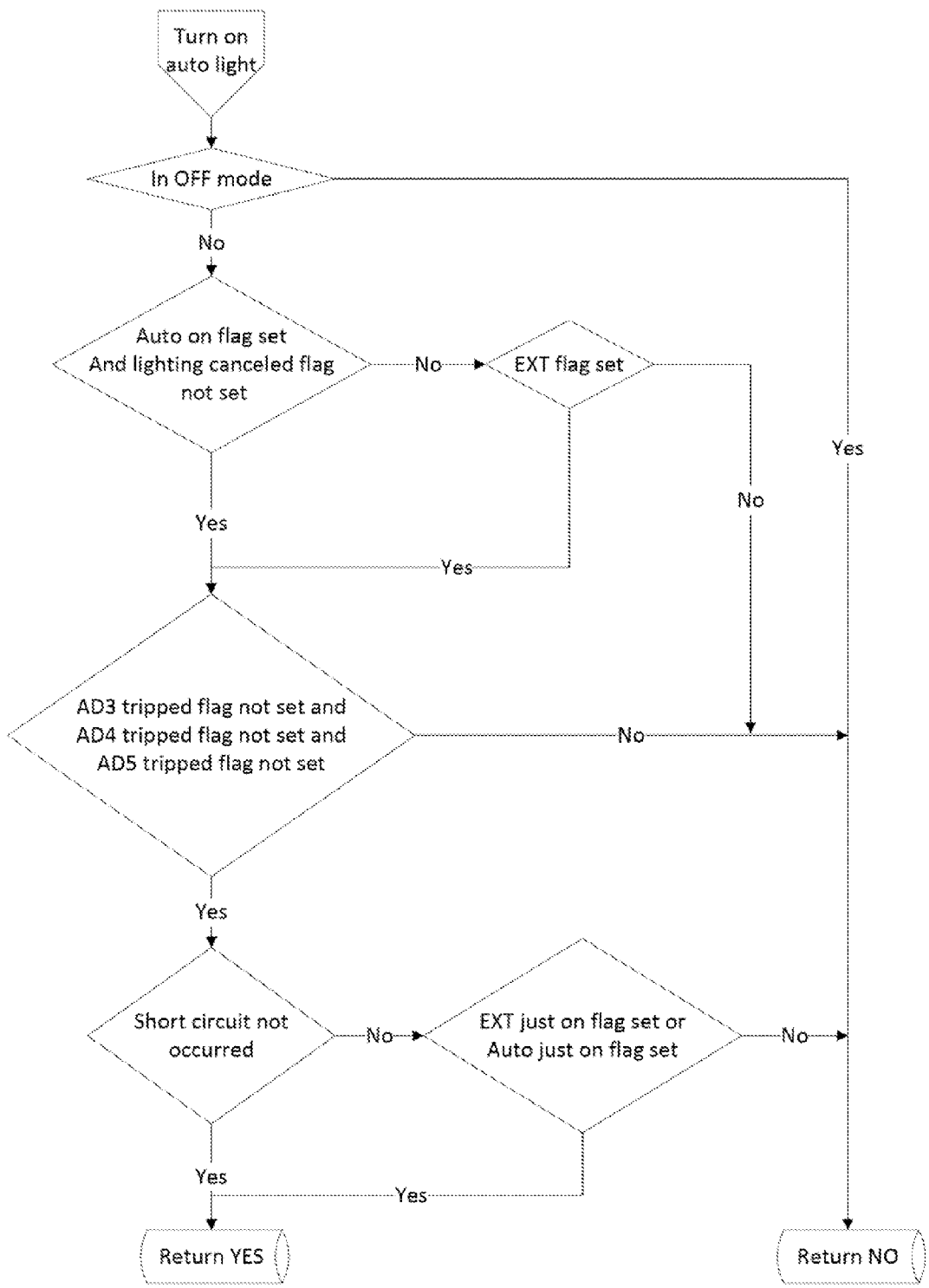
Figure 12N:
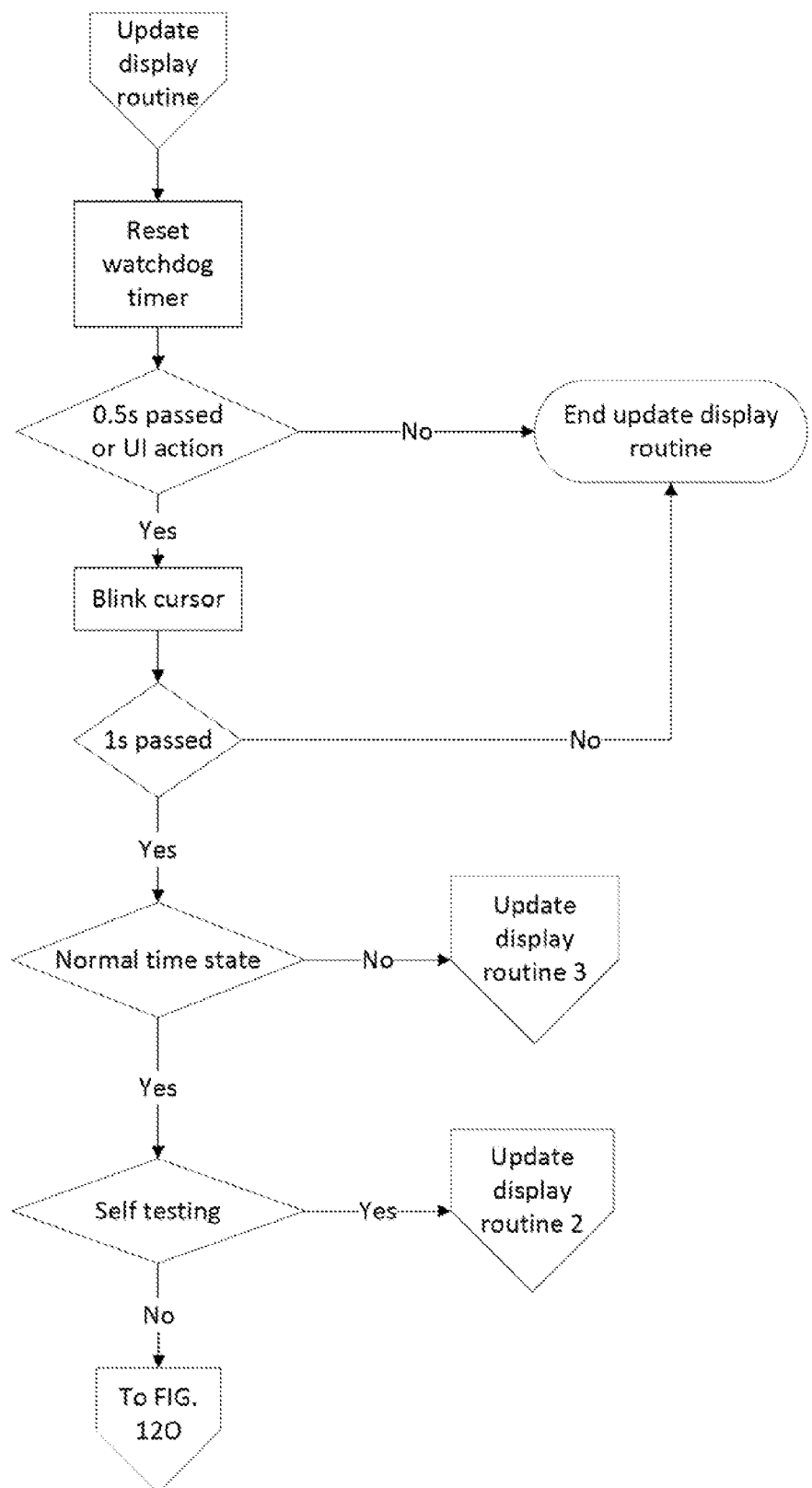
Figure 12O:
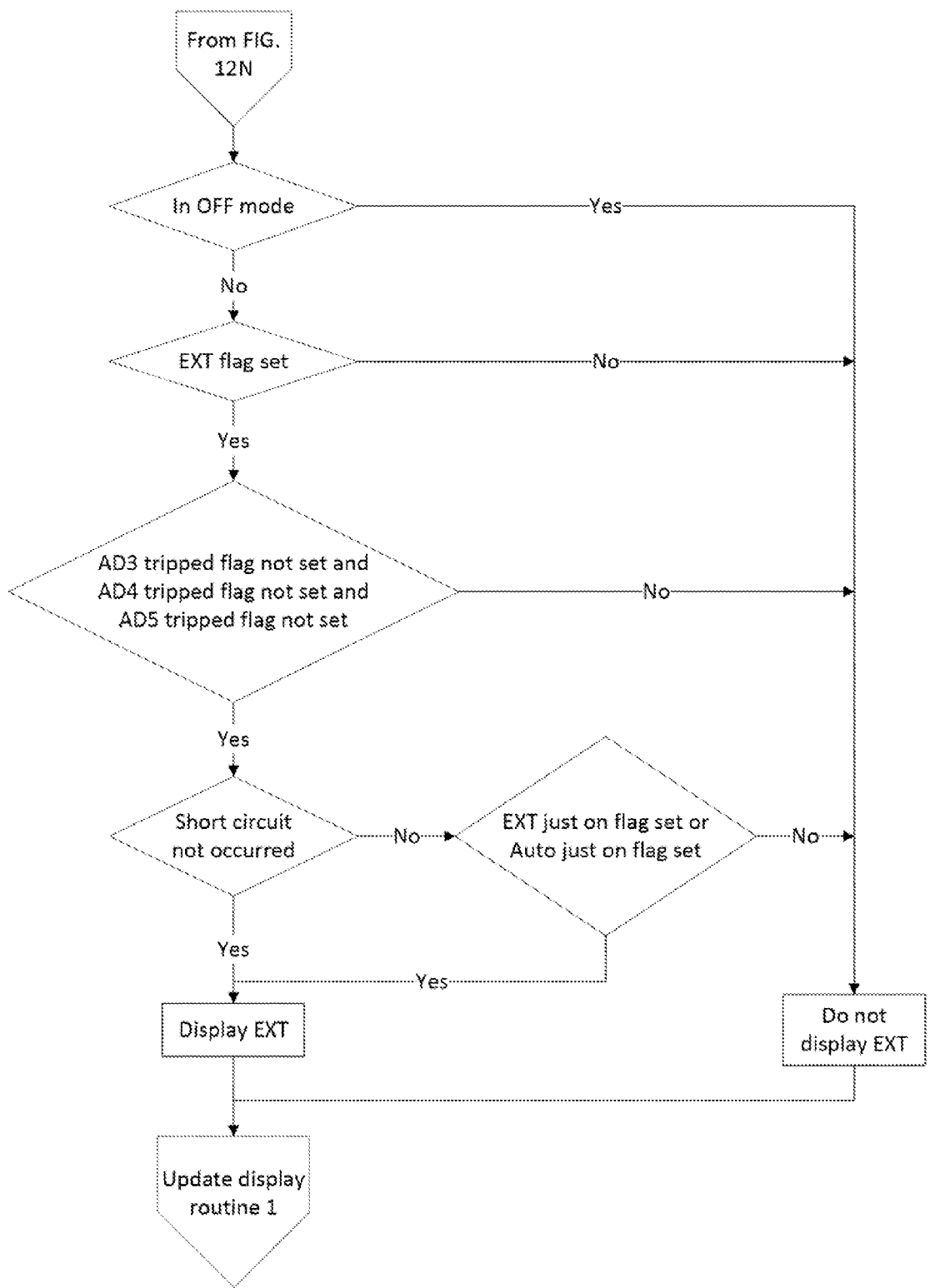
Figure 12P:
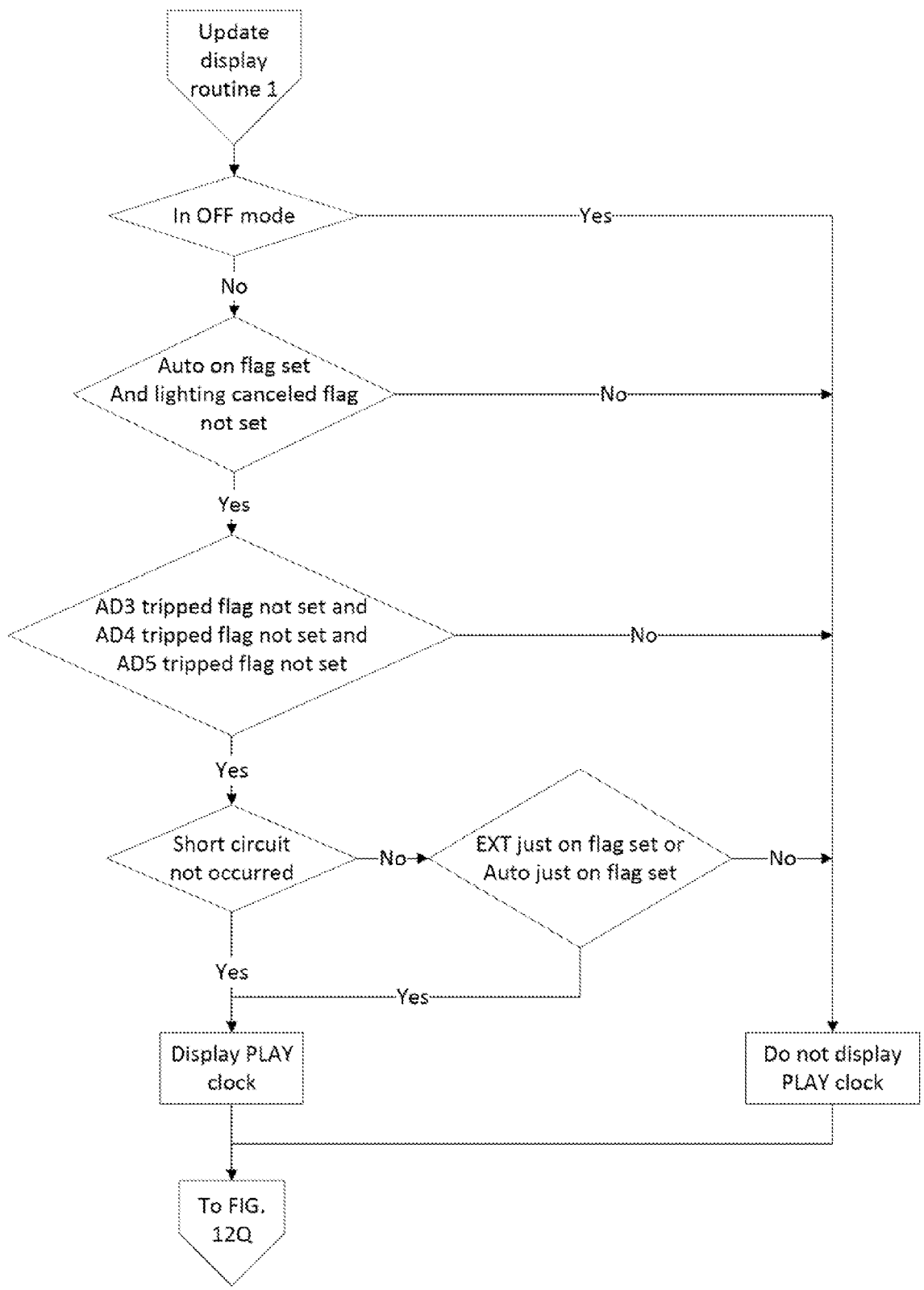
Figure 12Q:
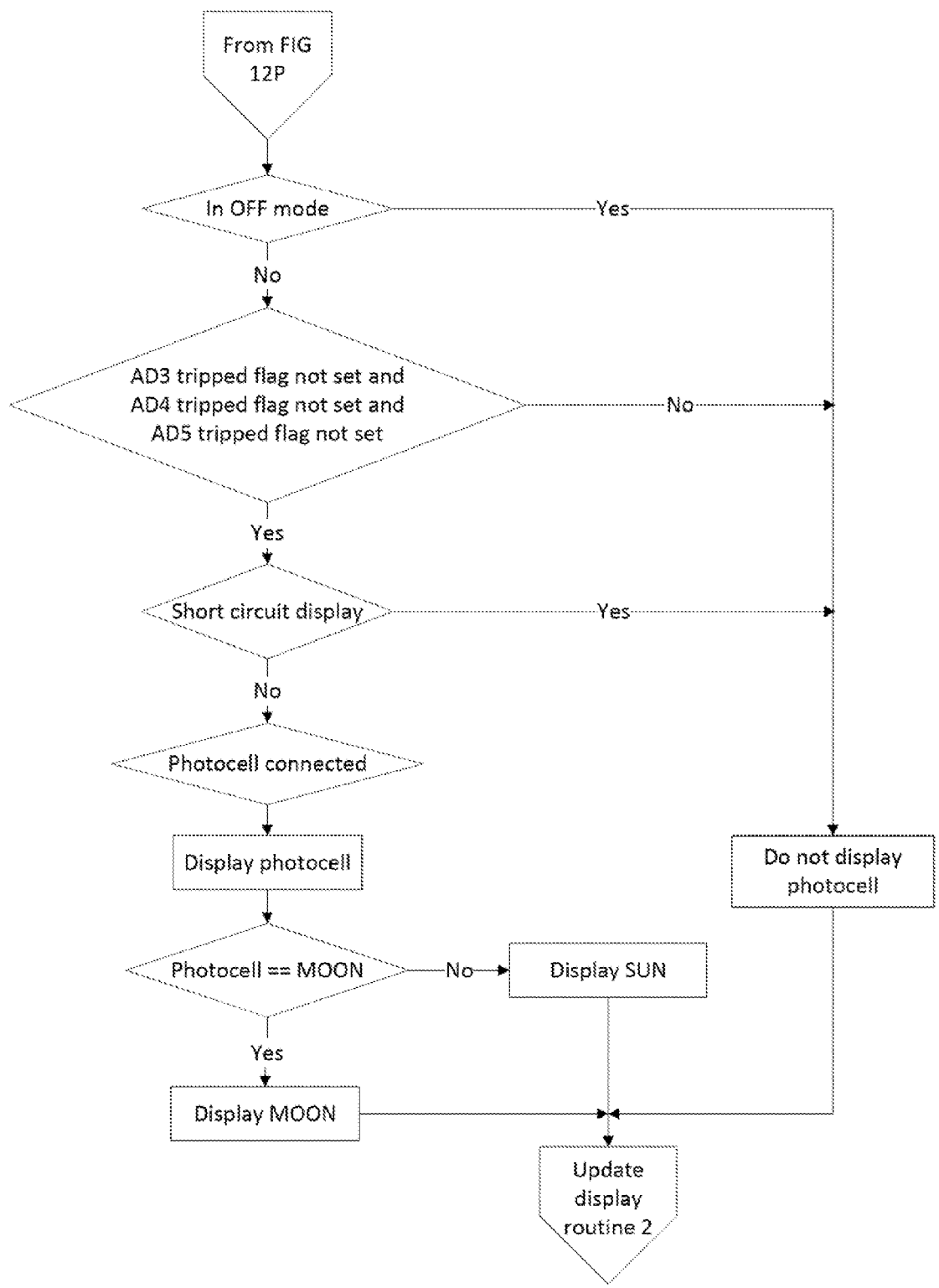
Figure 12R:
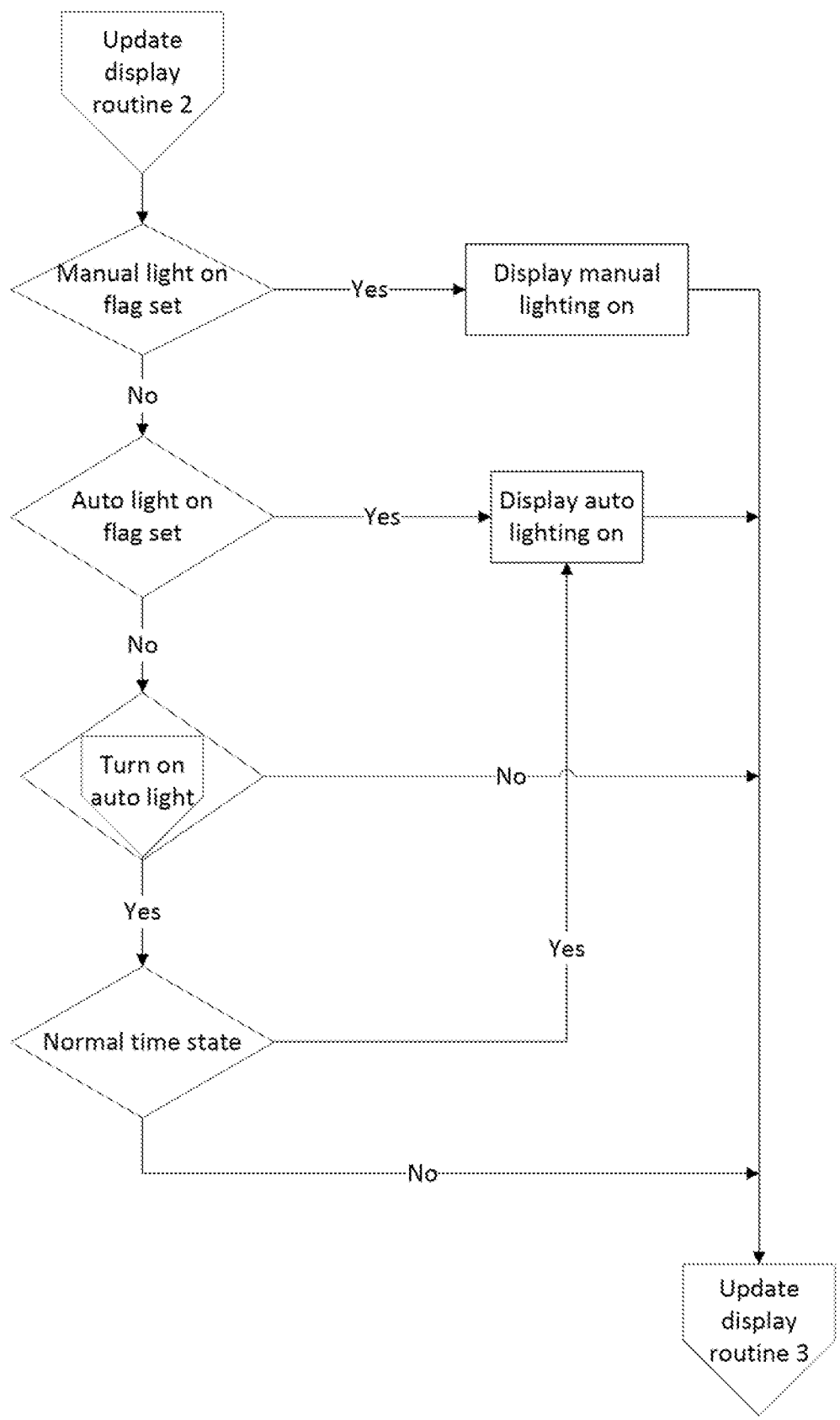
Figure 12S:
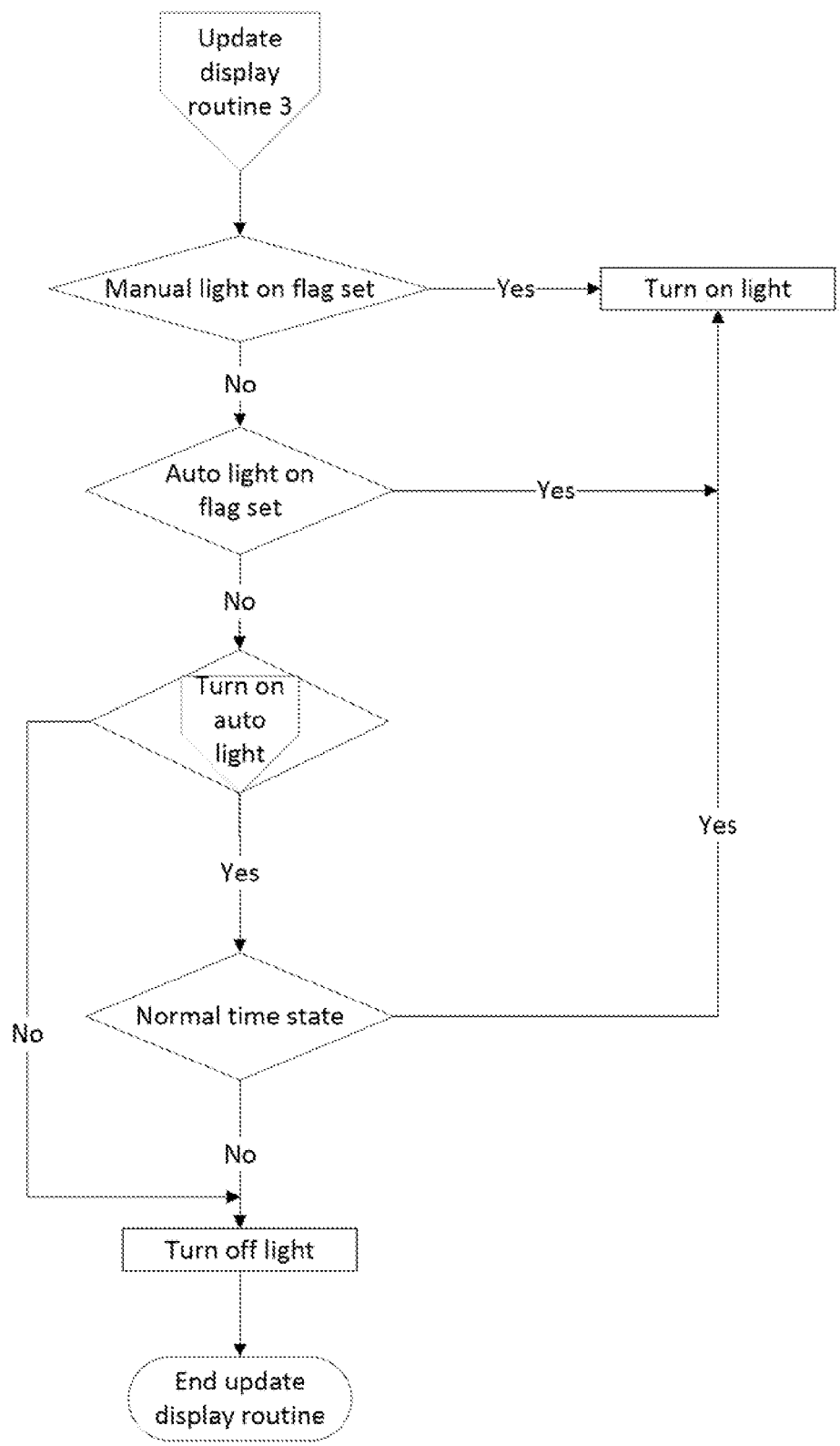
Figure 12T:
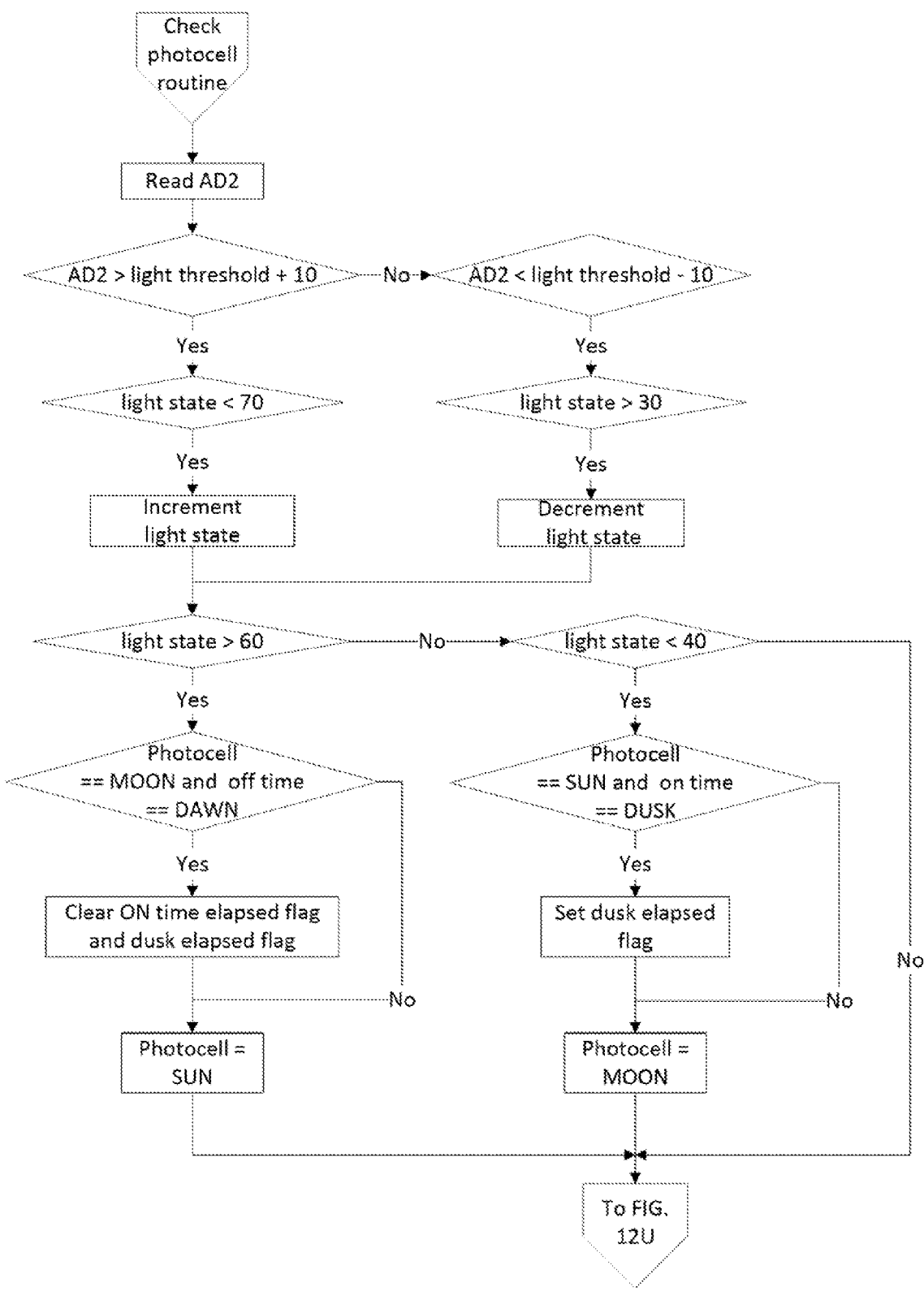
Figure 12U:
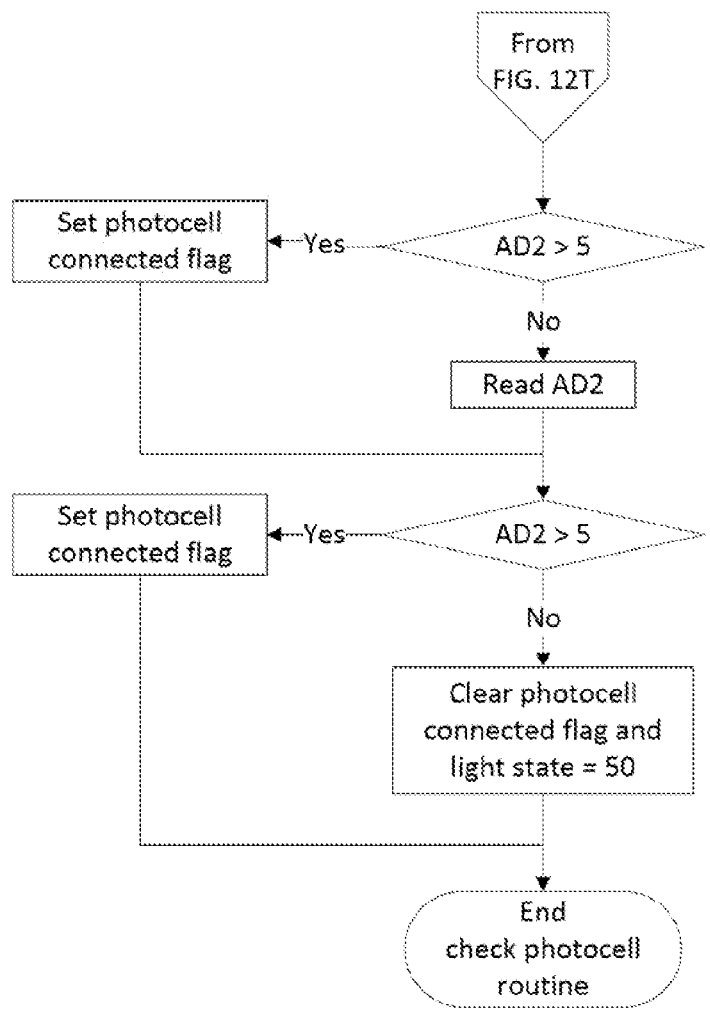
Figure 12V:
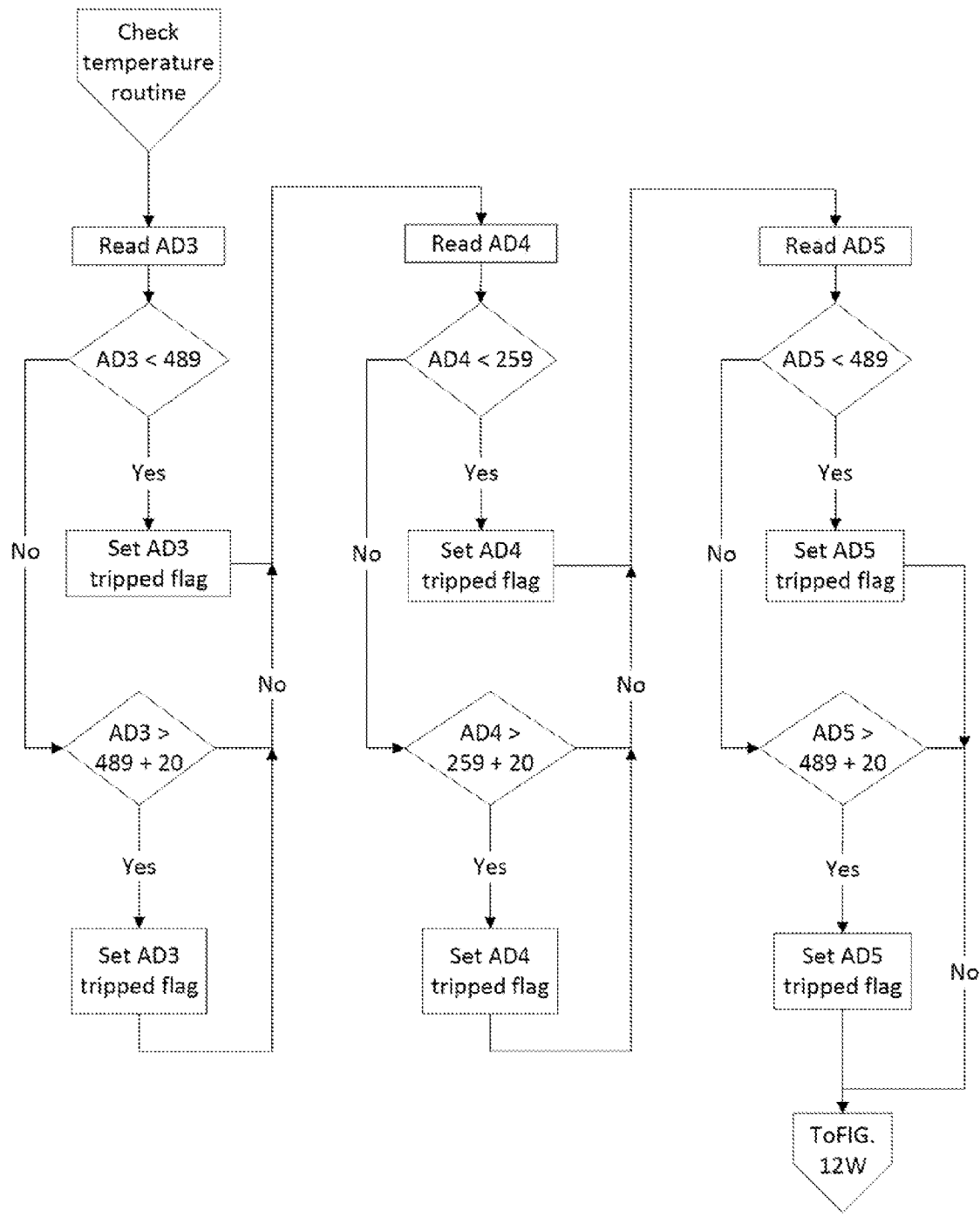
Figure 12W:
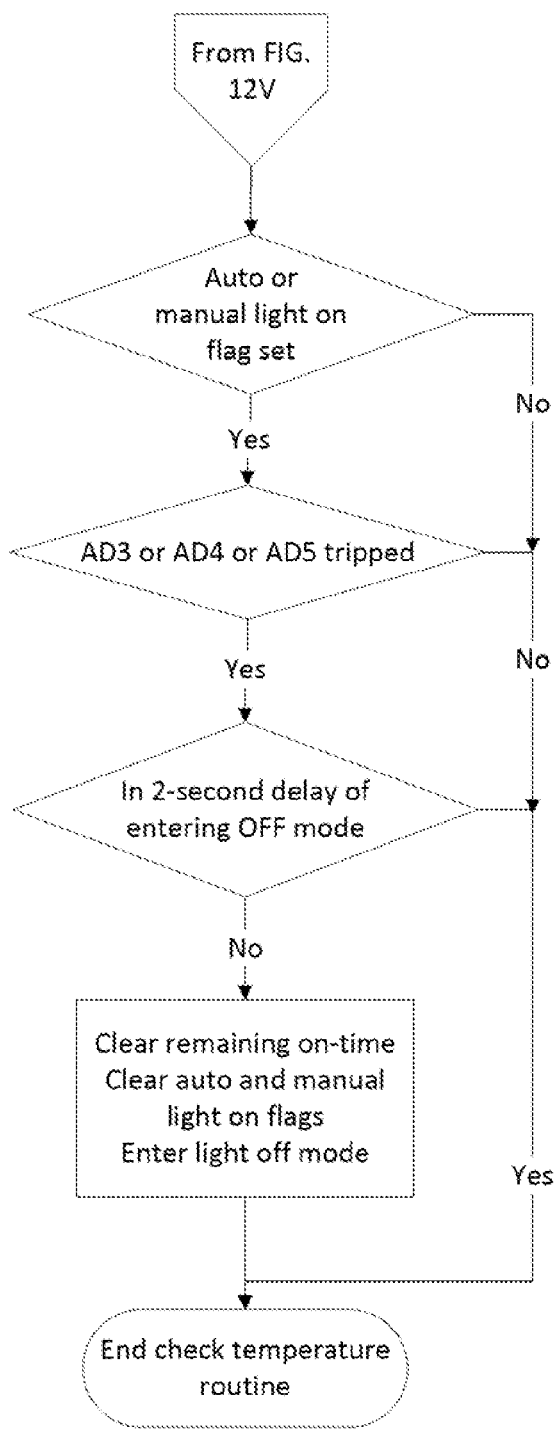
Figure 12X:
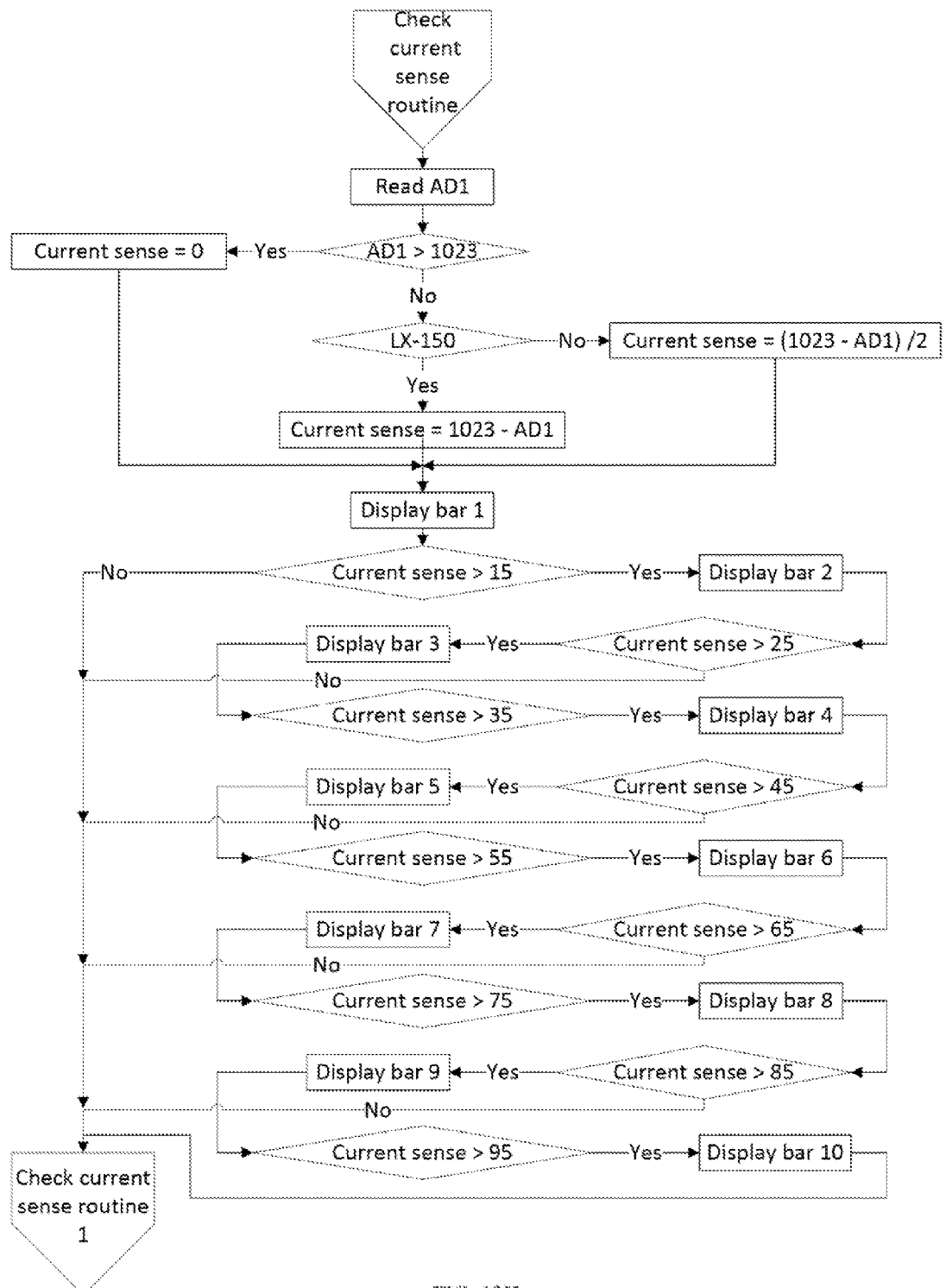
Figure 12Y:
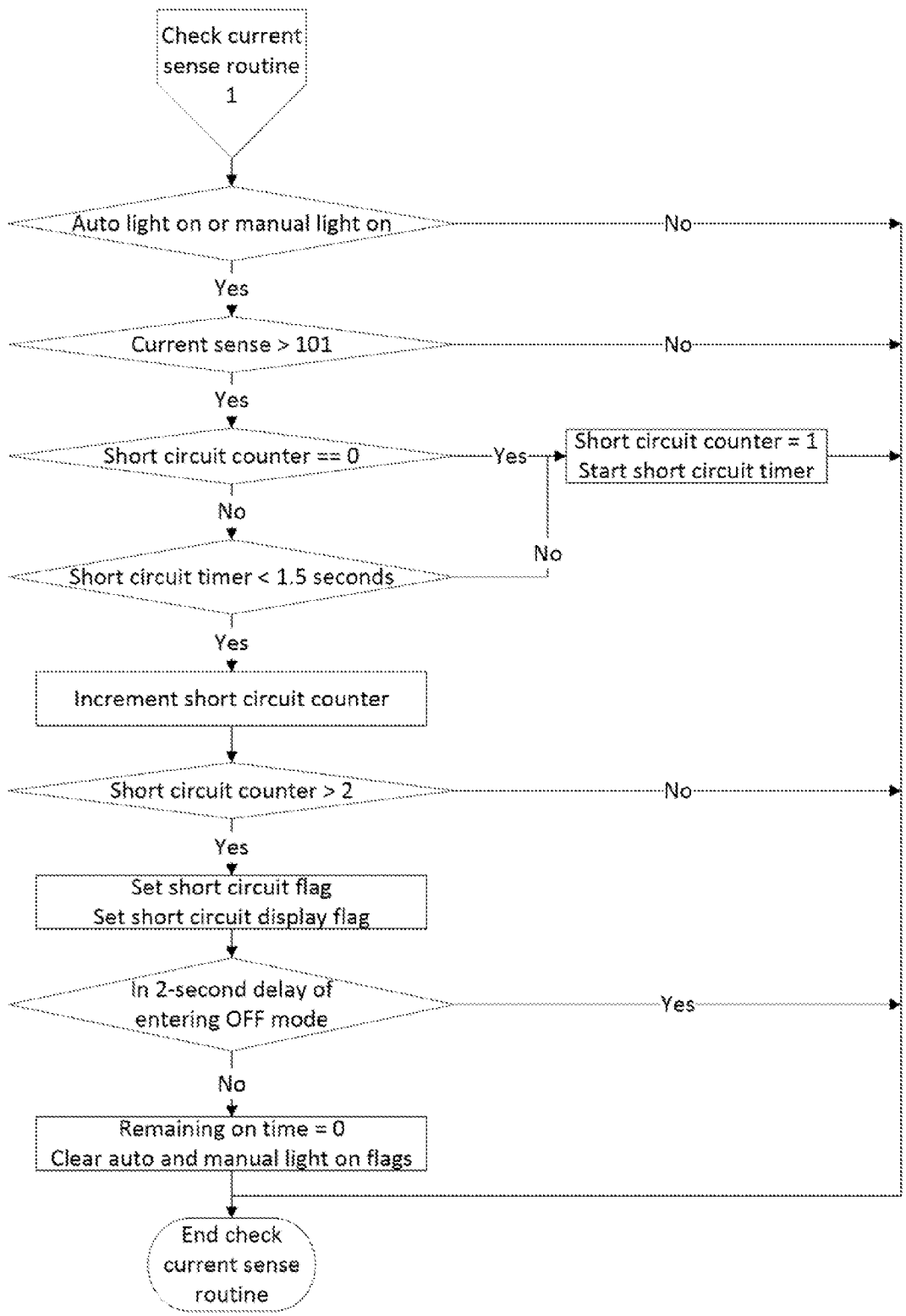

The microcontroller 50 (FIG. 11) and the firmware stored within, in conjunction with the pushbuttons 16a-16d and LCD 18 (FIG. 2), facilitate programming of the landscape lighting controller 10 by a homeowner or maintenance personnel. FIGS. 12A-12Y taken together are a flow chart illustrating the firmware that is stored in microcontroller 50 and provides the operational program of the landscape lighting controller 10. FIGS. 12C and 12D together illustrate the update time and date routine. FIGS. 12E and 12F together illustrate the process UI routine. FIGS. 12J and 12K together illustrate the lighting schedule routine. FIGS. 12N and 12O together illustrate the update display routine. FIGS. 12P and 12Q together illustrate the update display routine 1. FIGS. 12T and 12U together illustrate the check photocell routine. FIGS. 12V and 12W together illustrate the check temperature routine. A mode button 16d (FIG. 2), when pressed, steps the user through the various setup screens. In conjunction with this action, the corresponding one of a set of different mode LED's 76a-76f mounted on the left side of the face pack 12 will be energized. Corresponding indicia, such as POWER and DAWN/DUSK (not illustrated in FIG. 2) can be applied via stickers, molding, or other cost-effective means to the region of the enclosure 14 to the left of the mode LEDs 76a-76f so that when they are energized green or red the user will have feedback regarding the status of the corresponding function. The plus, minus, next, and mode buttons 16a-16d allow the user to navigate with the aid of the symbols LCD 18 and change the various parameters some of which are indicated by graphics in FIG. 2. Pushing the mode button 16d repeatedly steps the user through the following screens:

Auto
Set Time
Set On Time
Set Off Time
Manual ON
OFF

The landscape lighting controller 10 can automatically detect when the photocell 56 is connected to the PC board inside the face pack 12. When the photocell 56 is connected the user has the option of turning light fixtures ON or OFF at dusk or dawn. The user may also mix dusk and dawn setting with time settings. For instance, the user may choose to turn the light fixtures ON at dusk, and off at 12 AM. In the alternative, the user may choose to turn the light fixtures ON at 8 PM and OFF at dawn. The landscape lighting controller 10 may also allow the user to program one or more ON and OFF times. In the manual mode of the landscape lighting controller 10, the user has the ability to turn the light fixtures ON for a desired duration of time. The OFF mode turns all the light fixtures OFF, and prevents them from turning ON again automatically.

A unique feature of the landscape lighting controller 10 is a feature hidden from the user that allows it to periodically measure the present light level and use this reading as the new LIGHT/DARK threshold for the photocell 56 (FIG. 11). This allows the user to tailor this setting to match the ambient light levels present at the installation location. This feature can be initiated by pushing the UP button 16c for an extended period of time.

Self-Diagnostic Capabilities

The landscape lighting controller 10 has several self-diagnostic capabilities that utilize four bi-color status indicator LEDs 78a-78d (FIG. 2) mounted along the bottom of the face pack 12, various firmware implemented functions, and aspects of the GUI implemented with the LCD 18 and the push buttons 16a-16d.

The status indicator LEDs 78a-78d can be lit either green or red to indicate the health or status of various signals. These include the 120 VAC input, the external input, the photocell input, and the secondary output. Corresponding indicia, such as PHOTOCELL and EXTERNAL INPUT (not illustrated in FIG. 2) can be applied via stickers, molding, or other cost-effective means to the region of the enclosure 14 below the mode LEDs 76a-76f so that when they are energized green or red the user will receive feedback regarding the corresponding function. Some of the status indicator LEDs 78a-78d simply illuminate green when the associated parameter is active or attached. For example, this is the case for the external input 68 and the photocell 56. The corresponding one of the status indicator LEDs 78a-78d will illuminate green if the secondary (12 VAC) output is ON, or red if it is overloaded.

In addition to the status indicator LEDs 78a-78d, the LCD 18 can be used as a diagnostic tool. It contains a bar graph 80 (FIG. 2) that graphically indicates the percentage of the rated output presently being used by the landscape light fixtures. This can help the user determine if more light fixtures may be safely connected to the output of the landscape lighting controller 10, as well as whether or not the output is drawing excessive current. The landscape lighting controller 10 can sense the current draw, display this information, and act on it. If the output is overloaded, the controller 10 will automatically shut down and display an error message (Err) on the LCD 18 in addition to lighting the corresponding one of the status indicator LEDs 78a-78d red. After several seconds, or the next time the output is scheduled to come ON again, the controller 10 will re-try the system, without any need for user intervention. The display of the percentage of output power in use via the bar graph 80, and the auto-retry feature are unique in the landscape lighting field. Other landscape lighting controllers cannot display the power being used, and instead contain circuit breakers that must be manually reset.

Fail Safe Features

The landscape lighting controller 10 has fail safe features that are based on its ability to sense temperature at the three different locations previously described. The power transformer 30 is preferably rated at several hundred watts and can therefore dissipate significant heat, especially if overloaded. The technique that is used to measure temperature at each of the same locations is the same, and uses a negative temperature coefficient thermistor. As the temperature increases, the resistance of the thermistor decreases. This resistance is placed in series with a fixed resistor (not illustrated) in the face pack 12, and the voltage at this junction is read via an A/D input of the microcontroller 50. Other devices and approaches can be used to measure temperate at the different locations, such as a solid state temperature sensor which could supply an analog or digital output. It is beneficial to monitor the temperature of the windings of the power transformer 30 via the temperature sensor 60. If a failure were to occur in the current sensing circuit, and a short occurred, the windings of the power transformer 30 could overheat and break down the insulation, potentially causing a fire. Sensing the temperature of the windings of the power transformer 30 allows the landscape lighting controller 10 to detect an overload condition and to shut down its outputs before overheating occurs. However, to successfully shut down the outputs, the circuitry on the power control PC board and in the face pack 12 must also work properly. Therefore, it is important to measure the temperature at these two points as well. This is accomplished via temperature sensors 66 and 74. The operational program allows the microcontroller 50 to determine an overheat condition based on the output signal from any of the three temperature sensors 60, 66 and 74 and to cause the relay 38 to disconnect the power transformer 30 from the source of AC power in response thereto.

While several embodiments of a landscape lighting controller have been described in detail, modifications and adaptations thereof will occur to those skilled in the art. For example, the same electro-mechanical designs could be used in a different type of landscape controller, i.e. an irrigation controller. The irrigation controller could be a so-called modular controller in which station modules and other feature modules are plugged into receptacles or bays behind the face pack adjacent the wire connection terminals. See, for example, U.S. Pat. No. 7,457,687 B1 granted Nov. 25, 2008 to LaMonte D. Porter and entitled "Irrigation Controller with Indirectly Powered Station Modules", assigned to Hunter Industries, Inc., the entire disclosure of which is hereby incorporated by reference. Accordingly, the term "landscape controller" as used herein encompasses landscape lighting controllers and irrigation controllers, and hybrids of these two devices. The control panel need not take the form of a removable face pack but could instead be an integral permanently mounted portion of a rectangular box-like outer housing. The locking structures may be round or oval shaped with or without parallel flat surfaces. The locking structures may also be square, generally rectangular, or formed as an outer surface of the face pack. There may be only one locking structure formed on the face pack. Other configurations can be provided to achieve the beneficial result of one aspect of the present invention of a face pack or other control panel in a landscape controller that can both pivot and slide within an outer protective housing between a first normal use position and a second service position and be held in the service position. The illustrated embodiments show the "use" position as being vertical and the "service" position as being horizontal, however these can be varied. Moreover, the illustrated embodiments have the additional beneficial feature of allowing removal of the control panel. Other switching devices could be used to connect and disconnect the power transformer to the AC power source besides the relay, including solid state switches. Various user programmable features could be added or removed. The bar graph display that shows the percentage of power used may be in the form of a pie chart, a number, or any other illustration to indicate the amount of power being used. The amount of power being used may be displayed as a percentage or as an actual amount, such as actual amperage. In addition, various self-diagnostic capabilities and fail safe features could be added or removed. A fuse could be installed in place of the magnetic circuit breaker, or this portion of the circuit could be removed all together. Therefore the protection afforded the present invention should only be limited in accordance with the scope of the following claims.

What is claimed is:

1. A landscape controller, comprising:
    an outer housing;
    a control panel mounted in the outer housing including a display, at least one manually actuable input device, a processor, a memory operatively connected to the processor, and an operational program stored in the memory and executable by the processor for allowing a user to enter ON and OFF times; and
    the control panel and the outer housing including structures for allowing the control panel to be pivoted and slid within the housing between a first use position and a second service position, wherein the control panel is a removable face pack, and wherein the structures for allowing the control panel to be pivoted and slid within the housing comprise a pair of pivot pins extending from opposite ends of the control panel and a pair of bearing slots in opposite sides of the outer housing configured to receive the pivot pins.

2. The landscape controller of claim 1 wherein the use position is substantially vertical and the service position is substantially horizontal.

3. The landscape controller of claim 1 wherein the control panel pivots from a substantially vertical use position and slides to a substantially horizontal use position.

4. The landscape controller of claim 3 wherein the outer housing includes a chassis with a plurality of fingers that define the bearing slots and a pair of lock recesses located adjacent opposite sides of the outer housing.

5. The landscape controller of claim 1 wherein the control panel is connected to power circuitry in the outer housing with a flexible cable.

6. The landscape controller of claim 1 and further including a locking mechanism for holding the control panel in its use position.

7. The landscape controller of claim 6 wherein the locking mechanism includes a least one locking pin on the control panel that can be received in a lock recess in the outer housing.

8. The landscape controller of claim 1 wherein the control panel is mounted in a first portion of the outer housing and a power transformer is mounted in a second portion of the outer housing.

9. The landscape controller of claim 1 and further comprising a plurality of wire connection terminals mounted in the outer housing that are concealed by the control panel when the control panel is in its use position and accessible by moving the control panel to its service position.

10. A lighting controller, comprising:
    a housing;
    a power transformer mounted in the housing for stepping down an inputted AC power signal at a first higher voltage to at least one output AC power signal at a second lower voltage for powering a plurality of light fixtures;
    a switching device that can be closed and opened to connect and disconnect a primary winding of the power transformer to a source of AC power that can provide the inputted AC power signal;
    at least one wire connection terminal connected to a secondary winding of the power transformer; and
    a face pack removably mounted in the housing and operatively connected to the source of AC power and the switching device, the face pack including a display, at least one manually actuable input device, a processor, a memory operatively connected to the processor, and an operational program stored in the memory and executable by the processor for allowing a user to enter ON and OFF times via the manually actuable input device and for closing and opening the switching device in accordance therewith.

11. The controller of claim 10 wherein the switching device is a relay and the processor controls the relay through a relay driver circuit.

12. The controller of claim 10 and further comprising a first temperature sensor adjacent the power transformer for providing a first temperature signal to the processor and wherein the operational program causes the switching device to disconnect the power transformer from the source of AC power if the first temperature signal indicates an overheat condition.

13. The controller of claim 12 and further comprising at least one additional temperature sensor in the face pack for providing an additional temperature signal to the processor and wherein the operational program causes the switching device to disconnect the power transformer from the source of AC power if the additional temperature signal indicates an overheat condition.

14. The controller of claim 10 and further comprising a current sensor that senses an amount of current being drawn by a plurality of lights connected to the secondary winding.

15. The controller of claim 14 wherein the operational program allows the processor to determine an overload condition utilizing a signal from the current sensor and automatically cause the switching device to disconnect the power transformer from the source of AC power.

16. The controller of claim 15 wherein the operational program will automatically cause the switching device to re-connect the power transformer to the source of AC power at a next scheduled ON time.

17. The controller of claim 10 and further comprising a photocell and wherein the operational program allows the processor to periodically determine a present light level based on an output signal from the photocell and detect a LIGHT/DARK threshold that is used to control the switching device to connect and disconnect the power transformer to the source of AC power in response to the detection of the LIGHT/DARK threshold.

18. The controller of claim 10 and further comprising an external input that allows the processor to be slaved to another controller.

19. The controller of claim 10 and further comprising a second transformer for connection to the AC power source and a rectifier circuit connected to the second transformer for supplying a DC power signal to the processor.

20. A lighting controller, comprising:
a housing;
a power transformer mounted in the housing for stepping down an inputted AC power signal at a first higher voltage to at least one output AC power signal at a second lower voltage for powering a plurality of light fixtures;
a switching device that can be closed and opened to connect and disconnect a primary winding of the power transformer to a source of AC power that can provide the inputted AC power signal;
at least one wire connection terminal connected to a secondary winding of the power transformer;
a current sensor that senses an amount of current drawn by a plurality of lights connected to the secondary winding; and
a control panel mounted in the housing and operatively connected to the source of AC power, the switching device and the current sensor, the control panel including a display, at least one manually actuable input device, a processor, a memory operatively connected to the processor, and an operational program stored in the memory and executable by the processor for allowing a user to enter ON and OFF times via the manually actuable input device and for closing and opening the switching device in accordance therewith and for indicating on the display the amount of current drawn by the plurality of lights.

21. The controller of claim 20 wherein the control panel is mounted in a face pack that is removably mounted in the housing and operatively connected to the source of AC power and the switching device.

22. The controller of claim 20 wherein the switching device is a relay and the processor controls the relay through a relay driver circuit.

23. The controller of claim 20 and further comprising a first temperature sensor adjacent the power transformer for providing a first temperature signal to the processor and wherein the operational program causes the switching device to disconnect the power transformer from the source of AC power if the first temperature signal indicates an overheat condition.

24. The controller of claim 23 and further comprising at least one additional temperature sensor in the control panel for providing an additional temperature signal to the processor and wherein the operational program causes the switching device to disconnect the power transformer from the source of AC power if the additional temperature signal indicates an overheat condition.

25. The controller of claim 20 wherein the operational program allows the processor determine an overload condition utilizing a signal from the current sensor and automatically cause the switching device to disconnect the power transformer from the source of AC power.

26. The controller of claim 25 wherein the operational program will automatically cause the switching device to re-connect the power transformer to the source of AC power at a next scheduled ON time.

27. The controller of claim 25 wherein the operational program will automatically cause the switching device to re-connect the power transformer to the source of AC power after a pre-determined off time.

28. The controller of claim 20 and further comprising a photocell and wherein the operational program allows the processor to periodically determine a present light level based on an output signal from the photocell and detect a LIGHT/DARK threshold that is used to control the switching device to connect and disconnect the power transformer to the source of AC power in response to the detection of the LIGHT/DARK threshold.

29. The controller of claim 20 and further comprising an external input that allows the processor to be slaved to another controller.

30. The controller of claim 20 where the amount of current is displayed using a bar graph.

31. The controller of claim 20 where the amount of current is displayed using a pie chart.

32. The controller of claim 20 where the amount of current is displayed using a number.

33. The controller of claim 20 where the amount of current is displayed is a percentage of the rated current.

34. The controller of claim 20 where the amount of current displayed is an actual amount of current used.

35. The controller of claim 34 where the amount of current displayed is the number of amps being used.

36. The controller of claim 20 and further comprising a second transformer for connection to the AC power source and a rectifier circuit connected to the second transformer for supplying a DC power signal to the processor.

37. A lighting controller, comprising:
a housing;
a power transformer mounted in the housing for stepping down an inputted AC power signal at a first higher voltage to at least one output AC power signal at a second lower voltage for powering a plurality of light fixtures;

a switching device that can be closed and opened to connect and disconnect a primary winding of the power transformer to a source of AC power that can provide the inputted AC power signal;
at least one wire connection terminal connected to a secondary winding of the power transformer;
a current sensor that senses an amount of current drawn by a plurality of lights connected to the secondary winding; and
a control panel mounted in the housing and operatively connected to the source of AC power, the switching device, and the current sensor, the control panel including a display, at least one manually actuable input device, a processor, a memory operatively connected to the processor, and an operational program stored in the memory and executable by the processor for allowing a user to enter ON and OFF times via the manually actuable input device and for closing and opening the switching device in accordance therewith and for detecting an overload condition based on an output of the current sensor, causing the switching device to disconnect the power transformer from the source of AC power in response to the detection of the overload condition, and for causing the switching device to re-connect the power transformer to the source of AC power at a next scheduled ON time.

38. The controller of claim 37 and further comprising a first temperature sensor adjacent the power transformer for providing a first temperature signal to the processor and wherein the operational program causes the switching device to disconnect the power transformer from the source of AC power if the first temperature signal indicates an overheat condition.

39. The controller of claim 38 and further comprising at least one additional temperature sensor in the control panel for providing an additional temperature signal to the processor and wherein the operational program causes the switching device to disconnect the power transformer from the source of AC power if the additional temperature signal indicates an overheat condition.

40. A lighting controller, comprising:
a housing;
a power transformer mounted in the housing for stepping down an inputted AC power signal at a first higher voltage to at least one output AC power signal at a second lower voltage for powering a plurality of light fixtures;
a switching device that can be closed and opened to connect and disconnect a primary winding of the power transformer to a source of AC power that can provide the inputted AC power signal;
at least one wire connection terminal connected to a secondary winding of the power transformer;
a photocell; and
a control panel mounted in the housing and operatively connected to the source of AC power, the switching device and the photocell, the panel control including a display, at least one manually actuable input device, a processor, a memory operatively connected to the processor, and an operational program stored in the memory and executable by the processor for allowing a user to enter ON and OFF times via the manually actuable input device and for closing and opening the switching device in accordance therewith and for allowing the processor to periodically determine a present light level based on an output signal from the photocell and detect a LIGHT/DARK threshold that is used to control the switching device to connect and disconnect the power transformer to the source of AC power in response to the detection of the LIGHT/DARK threshold.

41. A lighting controller, comprising:
a housing;
a power transformer mounted in the housing for stepping down an inputted AC power signal at a first higher voltage to at least one output AC power signal at a second lower voltage for powering a plurality of light fixtures;
a switching device that can be closed and opened to connect and disconnect a primary winding of the power transformer to a source of AC power that can provide the inputted AC power signal
at least one wire connection terminal connected to a secondary winding of the power transformer;
a first temperature sensor located adjacent the power transformer for providing a first temperature signal;
a second transformer that can be connected to the source of AC power;
a rectifier circuit connected to the second transformer for supplying a DC power signal;
a second temperature sensor located adjacent the second transformer for providing a second temperature signal; and
a control panel mounted in the housing and operatively connected to the source of AC power and the switching device, the control panel including a display, at least one manually actuable input device, a processor, a memory operatively connected to the processor, and an operational program stored in the memory and executable by the processor for allowing a user to enter ON and OFF times via the manually actuable input device and for closing and opening the switching device in accordance therewith and for detecting an overheat condition based on the first temperature signal or the second temperature signal, and causing the switching device to disconnect the power transformer from the source of AC power in response to the detection of the overheat condition.

* * * * *